United States Patent
Miyoshi

(10) Patent No.: US 10,234,527 B2
(45) Date of Patent: Mar. 19, 2019

(54) MAGNETIC RESONANCE SYSTEM AND METHOD FOR OBTAINING A Z-SPECTRUM OF A CEST IMAGING TECHNIQUE

(71) Applicant: General Electric Company, Schenectady, NY (US)

(72) Inventor: Mitsuharu Miyoshi, Tokyo (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 352 days.

(21) Appl. No.: 15/152,291

(22) Filed: May 11, 2016

(65) Prior Publication Data

US 2016/0334485 A1   Nov. 17, 2016

(30) Foreign Application Priority Data

May 14, 2015   (JP) .................................. 2015-099332

(51) Int. Cl.
 *G01V 3/00* (2006.01)
 *G01R 33/54* (2006.01)
 *G01R 33/56* (2006.01)

(52) U.S. Cl.
 CPC ................................ *G01R 33/5605* (2013.01)

(58) Field of Classification Search
 CPC ............ G01R 33/3815; G01R 33/5605; G01R 33/5608; G01R 33/5601; G01R 33/5616; G01R 33/385; G01R 33/485; G01R 33/4833; A61B 5/055; A61B 5/4848; A61B 5/4312
 See application file for complete search history.

(56) References Cited

U.S. PATENT DOCUMENTS

| | | | |
|---|---|---|---|
| 9,720,061 B2 * | 8/2017 | Ouyang | ............. G01R 33/5605 |
| 2011/0152671 A1 | 6/2011 | Aime et al. | |
| 2011/0243859 A1 * | 10/2011 | Port | .................. A61K 49/1812 |
| | | | 424/9.361 |
| 2011/0288402 A1 | 11/2011 | Pikkemaat et al. | |
| 2013/0147477 A1 * | 6/2013 | Singh | ..................... G01R 33/28 |
| | | | 324/309 |

(Continued)

FOREIGN PATENT DOCUMENTS

| JP | 2012-500692 A | 1/2012 |
|---|---|---|
| JP | 2012513239 A | 6/2012 |

(Continued)

OTHER PUBLICATIONS

JP OA for Application No. 2015-099332 with English Translation. Office Action dated Sep. 5, 2017, 2 pages.

(Continued)

*Primary Examiner* — Minh N Tang

(57) ABSTRACT

For the purpose of obtaining a spectrum suitable for acquiring information on a CEST effect, an MR apparatus comprises a Z-spectrum generating unit 91 for generating a Z-spectrum containing a CEST component representing a signal component affected by CEST and a baseline component representing a signal component unaffected by CEST based on data acquired by a plurality of sequences; a spectrum transforming unit 92 for transforming the Z-spectrum into a CPE spectrum; and first fitting unit 95 for calculating values of a plurality of coefficients included in a CEST term in an approximate expression of the CPE spectrum.

8 Claims, 28 Drawing Sheets

(56) References Cited

U.S. PATENT DOCUMENTS

2014/0062473 A1  3/2014  Miyazaki et al.
2015/0077110 A1  3/2015  Miyoshi

FOREIGN PATENT DOCUMENTS

JP  2014-046209 A  3/2014
JP  2015-058145 A  3/2015

OTHER PUBLICATIONS

Trott et al., "R1p Relaxation outside of the Fast-Exchange Limit", Journal of Magnetic Resonance, vol. No. 154, pp. 157-160, 2002.
Zaiss et al., "Exchange-dependent relaxation in the rotating", Research Article, vol. No. 26, pp. 507-518, 2013.

* cited by examiner

FIG. 5A
FIG. 5B
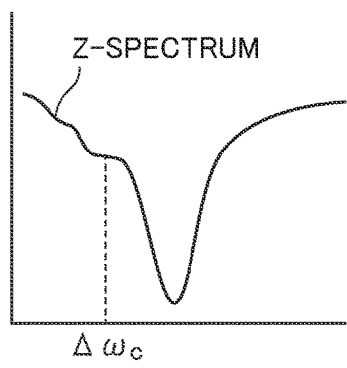
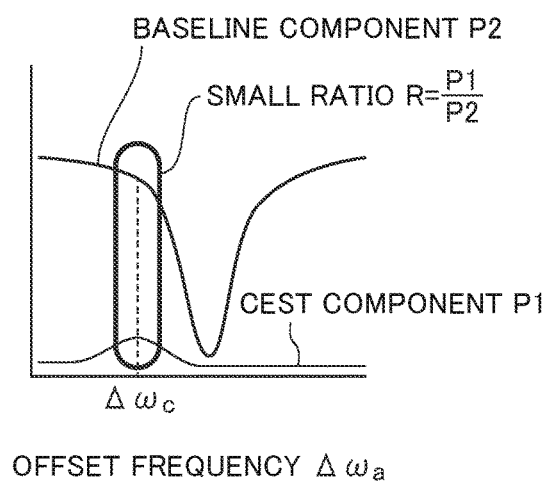

Z-SPECTRUM

OFFSET FREQUENCY $\Delta \omega_a$

CPE SPECTRUM $F_{CPE}(\Delta \omega_a)$ $\Delta \omega_{c,1}$    0    $\Delta \omega_{c,2}$
OFFSET FREQUENCY $\Delta \omega_a$

|  | BASELINE TERM | CEST TERM $F_{L,1}(\Delta \omega_a)$ |
|---|---|---|
|  | $(C_0, C_{MT})$ | $(a_{1,1}, a_{2,1}, \Delta \omega_{C,1})$ |
| VALUES CALCULATED AT STEP ST6 | $(C_0(1), C_{MT}(1))$ | $(a_{1,1}(1), a_{2,1}(1), \Delta \omega_{C,1}(1))$ |

| | BASELINE TERM | CEST TERM $F_{L,1}(\Delta \omega_a)$ | |
|---|---|---|---|
| | $(C_0, C_{MT})$ | $(a_{1,1}, a_{2,1}, \Delta \omega_{C,1})$ | $(b_0, b_1, b_2, \Delta \omega_0)$ |
| VALUES CALCULATED AT STEP ST6 | $(C_0(1), C_{MT}(1))$ | $(a_{1,1}(1), a_{2,1}(1), \Delta \omega_{C,1}(1))$ | |
| VALUES CALCULATED AT STEP ST72 | | | $(b_0(1), b_1(1), b_2(1), \Delta \omega_0(1))$ |

| | BASELINE TERM | CEST TERM $F_{L,1}(\Delta\omega_a)$ | |
|---|---|---|---|
| | $(c_0, c_{MT})$ | $(a_{1,1}, a_{2,1}, \Delta\omega_{C,1})$ | $(b_0, b_1, b_2, \Delta\omega_0)$ |
| VALUES CALCULATED AT STEP ST6 | $(c_0(1), c_{MT}(1))$ | $(a_{1,1}(1), a_{2,1}(1), \Delta\omega_{C,1}(1))$ | |
| VALUES CALCULATED AT STEP ST72 | $(c_0(1)', c_{MT}(1)')$ | | $(b_0(1), b_1(1), b_2(1), \Delta\omega_0(1))$ |

|  | BASELINE TERM | CEST TERM $F_{L,2}(\Delta \omega_a)$ |
|---|---|---|
|  | ($C_0$, $C_{MT}$) | ($a_{1,2}$, $a_{2,2}$, $\Delta \omega_{C,2}$) |
| VALUES CALCULATED AT STEP ST6 | ($C_0(2)$, $C_{MT}(2)$) | ($a_{1,2}(2)$, $a_{2,2}(2)$, $\Delta \omega_{C,2}(2)$) |

| | BASELINE TERM | CEST TERM $F_{L,2}(\Delta\omega_a)$ | |
|---|---|---|---|
| | | $(a_{1,2}, a_{2,2}, \Delta\omega_{C,2})$ | $(b_0, b_1, b_2, \Delta\omega_0)$ |
| VALUES CALCULATED AT STEP ST6 | $(C_0, C_{MT})$ | | |
| VALUES CALCULATED AT STEP ST72 | $(C_0(2), C_{MT}(2))$ | $(a_{1,2}(2), a_{2,2}(2), \Delta\omega_{C,2}(2))$ | $(b_0(2), b_1(2), b_2(2), \Delta\omega_0(2))$ |

| | BASELINE TERM | CEST TERM $F_{L,2}(\Delta\omega_a)$ | |
|---|---|---|---|
| | $(c_0, C_{MT})$ | $(a_{1,2}, a_{2,2}, \Delta\omega_{c,2})$ | $(b_0, b_1, b_2, \Delta\omega_0)$ |
| VALUES CALCULATED AT STEP ST6 | $(c_0(2), C_{MT}(2))$ | $(a_{1,2}(2), a_{2,2}(2), \Delta\omega_{c,2}(2))$ | |
| VALUES CALCULATED AT STEP ST72 | $(c_0(2)', C_{MT}(2)')$ | | $(b_0(2), b_1(2), b_2(2), \Delta\omega_0(2))$ |

|  | BASELINE TERM | CEST TERM $F_{L,i}(\Delta\omega_a)$ |
|---|---|---|
|  | $(C_0, C_{MT})$ | $(a_{1,i}, a_{2,i}, \Delta\omega_{C,i})$ |
| VALUES CALCULATED AT STEP ST6 | $(C_0(i), C_{MT}(i))$ | $(a_{1,i}(i), a_{2,i}(i), \Delta\omega_{C,i}(i))$ |

FIG.22

| (n = i) | BASELINE TERM | CEST TERM $F_{L,i}(\Delta\omega_a)$ | |
|---|---|---|---|
| | $(c_0, c_{MT})$ | $(a_{1,i}, a_{2,i}, \Delta\omega_{C,i})$ | $(b_0, b_1, b_2, \Delta\omega_0)$ |
| VALUES CALCULATED AT STEP ST6 | $(c_0(i), c_{MT}(i))$ | $(a_{1,i}(i), a_{2,i}(i), \Delta\omega_{C,i}(i))$ | |
| VALUES CALCULATED AT STEP ST72 | | | $(b_0(i), b_1(i), b_2(i), \Delta\omega_0(i))$ |

| | BASELINE TERM | CEST TERM $F_{L,i}(\Delta\omega_a)$ | |
|---|---|---|---|
| | $(C_0, C_{MT})$ | $(a_{1,i}, a_{2,i}, \Delta\omega_{C,i})$ | $(b_0, b_1, b_2, \Delta\omega_0)$ |
| VALUES CALCULATED AT STEP ST6 | $(C_0(i), C_{MT}(i))$ | $(a_{1,i}(i), a_{2,i}(i), \Delta\omega_{C,i}(i))$ | |
| VALUES CALCULATED AT STEP ST72 | $(C_0(i)', C_{MT}(i)')$ | | $(b_0(i), b_1(i), b_2(i), \Delta\omega_0(i))$ |

MAGNETIC RESONANCE SYSTEM AND METHOD FOR OBTAINING A Z-SPECTRUM OF A CEST IMAGING TECHNIQUE

CROSS-REFERENCE TO RELATED APPLICATIONS

This application claims priority to Japanese patent application number 2015-099332, filed on May 14, 2015, the entirety of which is incorporated herein by reference.

BACKGROUND

The present invention relates to a magnetic resonance system for obtaining a Z-spectrum of a CEST (Chemical Exchange Saturation Transfer) imaging technique, and a method applied to the magnetic resonance apparatus.

Recently, a method that attracts attention for observing a low-concentration compound is a CEST (Chemical Exchange Saturation Transfer) imaging technique, which takes advantage of signal decay resulting from chemical exchange.

CEST imaging performs a sequence while changing the frequency of an RF pulse, and generates a Z-spectrum based on data acquired by the sequence. The signal value in the Z-spectrum decays in the vicinity of the frequency at which a CEST effect is brought about. Therefore, by identifying at what frequency the signal decays from the Z-spectrum, information on CEST that depends upon the concentration of a compound or the rate of magnetization exchange may be obtained.

The Z-spectrum, however, has a dominating downward peak in the vicinity of the resonance frequency of water, which represents a Lorentz distribution of free water. The peak width of the peak is proportional to a transmission magnetic field B1, and the peak value reaches down to as low as near zero. Therefore, a signal lowering caused by CEST is buried in the downward peak representing the Lorentz distribution of free water, resulting in a problem that it is difficult to pick up information reflecting the effect of CEST from the Z-spectrum.

Therefore, there is the need for a technique for obtaining a spectrum suitable for obtaining information on CEST.

SUMMARY

The present invention, in its first aspect, is a magnetic resonance apparatus for obtaining information reflecting transfer of magnetization caused by CEST (chemical exchange saturation transfer) between a first substance containing protons and a second substance containing protons, said apparatus comprising a scanning unit for performing a plurality of sequences each having an RF pulse, wherein each said sequence is configured to have said RF pulse of different frequency; a spectrum generating unit for generating a Z-spectrum based on data acquired by said plurality of sequences, said Z-spectrum containing a CEST component representing a signal component affected by CEST and a baseline component representing a signal component unaffected by CEST; a spectrum transforming unit for transforming said Z-spectrum into a first spectrum so that a ratio between a signal value of the CEST component and that of the baseline component in said first spectrum is larger than a ratio between a signal value of the CEST component and that of the baseline component in said Z-spectrum at a frequency at which an effect of CEST is brought about; and a unit for obtaining information on the CEST component contained in said first spectrum.

The present invention, in its second aspect, is a magnetic resonance apparatus for obtaining information reflecting transfer of magnetization caused by CEST (chemical exchange saturation transfer) between a first substance containing protons and a second substance containing protons, said apparatus comprising a scanning unit for performing a plurality of sequences each having pulse sets each comprising a plurality of RF pulses, wherein a phase of said plurality of RF pulses is cycled so that each said sequence has a different phase difference between a phase of a p-th one and that of a (p+1)-th one of said plurality of RF pulses; a spectrum generating unit for generating a Z-spectrum based on data acquired by said plurality of sequences, said Z-spectrum containing a CEST component representing a signal component affected by CEST and a baseline component representing a signal component unaffected by CEST; a spectrum transforming unit for transforming said Z-spectrum into a first spectrum so that a ratio between a signal value of the CEST component and that of the baseline component in said first spectrum is larger than a ratio between a signal value of the CEST component and that of the baseline component in said Z-spectrum at a phase difference at which an effect of CEST is brought about; and a unit for obtaining information on the CEST component contained in said first spectrum.

The present invention, in its third aspect, is a program applied to a magnetic resonance apparatus for obtaining information reflecting transfer of magnetization caused by CEST (chemical exchange saturation transfer) between a first substance containing protons and a second substance containing protons, said apparatus comprising scanning unit for performing a plurality of sequences each having an RF pulse, wherein each said sequence is configured to have said RF pulse of different frequency, said program causing a computer to execute a spectrum generating processing of generating a Z-spectrum based on data acquired by said plurality of sequences, said Z-spectrum containing a CEST component representing a signal component affected by CEST and a baseline component representing a signal component unaffected by CEST; a spectrum transforming processing of transforming said Z-spectrum into a first spectrum so that a ratio between a signal value of the CEST component and that of a baseline component in said first spectrum is larger than a ratio between a signal value of the CEST component and that of the baseline component in said Z-spectrum at a frequency at which an effect of CEST is brought about; and processing of obtaining information on the CEST component contained in said first spectrum.

The present invention, in its fourth aspect, is a program applied to a magnetic resonance apparatus for obtaining information reflecting transfer of magnetization caused by CEST (chemical exchange saturation transfer) between a first substance containing protons and a second substance containing protons, said apparatus comprising scanning unit for performing a plurality of sequences each having pulse sets each comprising a plurality of RF pulses, wherein a phase of said plurality of RF pulses is cycled so that each said sequence has a different phase difference between a phase of a p-th one and that of a (p+1)-th one of said plurality of RF pulses, said program causing a computer to execute spectrum generating processing of generating a Z-spectrum based on data acquired by said plurality of sequences, said Z-spectrum containing a CEST component representing a signal component affected by CEST and a baseline component representing a signal component unaffected by CEST; spectrum transforming processing of transforming said Z-spectrum into a first spectrum so that a ratio between a signal value of the CEST component and that of the baseline component in said first spectrum is larger than a ratio between a signal value of the CEST component and that of the baseline component in said Z-spectrum at a phase difference at which an effect of CEST is brought about; and processing of obtaining information on the CEST component contained in said first spectrum.

A Z-spectrum is transformed into a first spectrum having a large ratio between a CEST component and a baseline component. Thus, by using the first spectrum, it is made easy to obtain information on CEST.

BRIEF DESCRIPTION OF THE DRAWINGS

FIGS. 5A and 5B are diagrams explaining a Z-spectrum;

FIG. 10 is a chart showing values of coefficients calculated by fitting;

FIG. 11 is a chart showing values of coefficients ($b_0$, $b_1$, $b_2$, $\Delta\omega_0$) calculated by fitting;

FIG. 12 is a chart showing values of calculated coefficients ($c_0$, $c_{MT}$);

FIG. 15 is a chart showing values of coefficients calculated by fitting;

FIG. 16 is a chart showing values of coefficients ($b_0$, $b_1$, $b_2$, $\Delta\omega_0$) calculated by fitting at n=2;

FIG. 17 is a chart showing values of calculated coefficients ($c_0$, $c_{MT}$);

FIG. 21 is a chart showing values of coefficients calculated at n=i;

FIG. 22 is a chart showing values of coefficients ($b_0$, $b_1$, $b_2$, $\Delta\omega_0$) calculated by fitting at n=i;

FIG. 23 is a chart showing values of calculated coefficients ($c_0$, $c_{MT}$);

DETAILED DESCRIPTION

Now embodiments for carrying out the invention will be described hereinbelow, although the present invention is not limited thereto.

Figure 1:
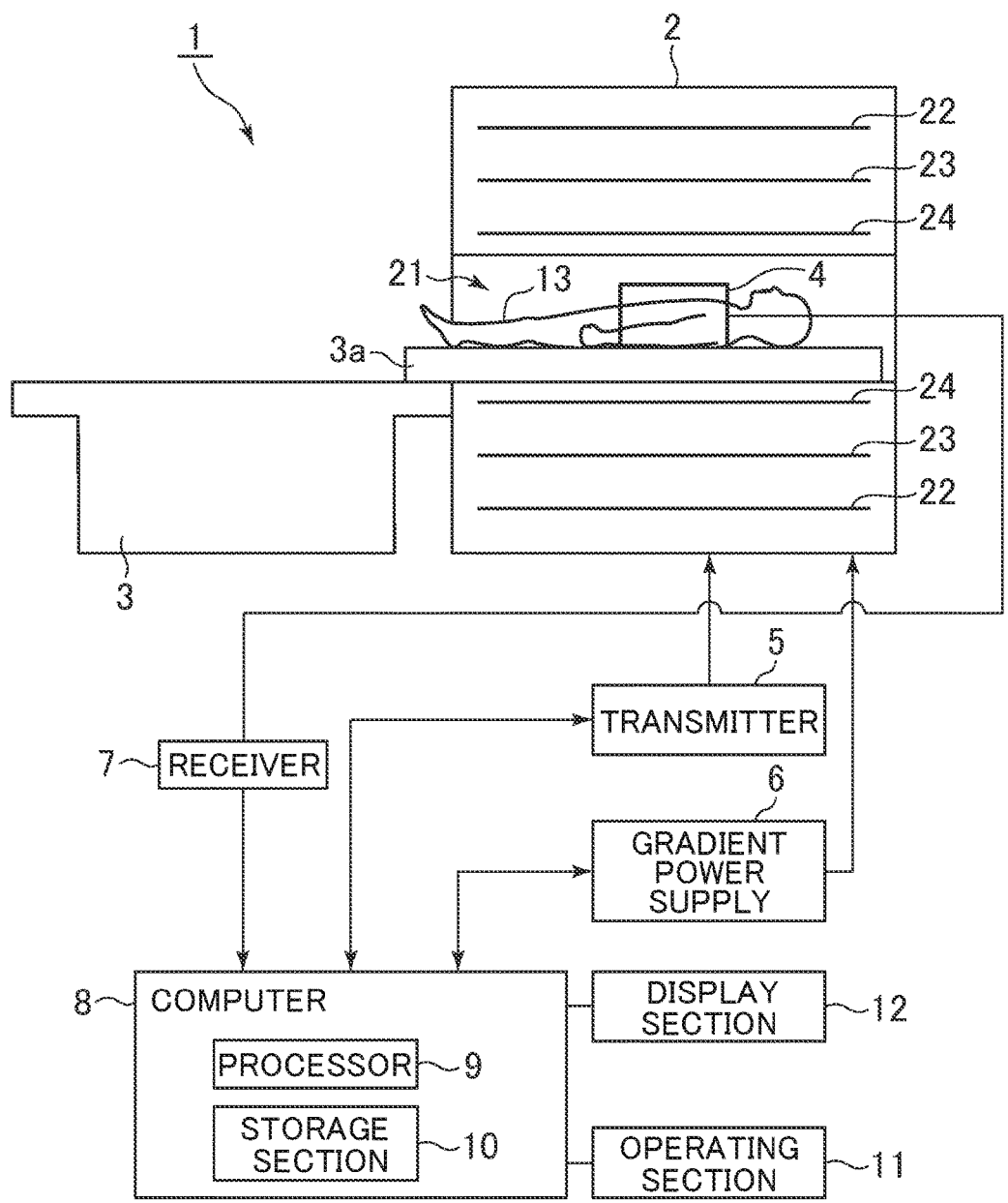
FIG. 1 is a schematic diagram of a magnetic resonance apparatus in a first embodiment of the present invention.

FIG. 1 is a schematic diagram of a magnetic resonance apparatus in a first embodiment of the present invention. The magnetic resonance apparatus (referred to as "MR apparatus" hereinbelow; MR: Magnetic Resonance) 1 comprises a magnet 2, a table 3, and a receiving RF coil (referred to as "receive coil" hereinbelow) 4.

The magnet 2 has a receiving space 21 in which a subject 13 is received. The magnet 2 also comprises a superconductive coil 22 for generating a static magnetic field, a gradient coil 23 for applying a gradient pulse, and an RF coil 24 for applying an RF pulse. A permanent magnet may be used in place of the superconductive coil.

The table 3 comprises a cradle 3a. The cradle 3a is configured to be movable into the receiving space 21. It is by the cradle 3a that the subject 13 is carried into the receiving space 21.

The receive coil 4 is attached to a region of the subject 13 covering the abdomen and chest. The receive coil 4 receives magnetic resonance signals from the subject 13.

The MR apparatus 1 further comprises a transmitter 5, a gradient power supply 6, a receiver 7, a computer 8, an operating section 11, and a display section 12.

The transmitter 5 supplies electric current to the RF coil 24, while the gradient power supply 6 supplies electric current to the gradient coil 23. The receiver 7 performs signal processing, such as detection/demodulation, on signals received from the receive coil 4. It should be noted that a combination of the magnet 2, receive coil 4, transmitter 5, gradient power supply 6, and receiver 7 corresponds to the scanning unit.

The computer 8 controls the operation of several sections in the MR apparatus 1 to implement several kinds of operation of the MR apparatus 1, including operations of transmitting required information to the display section 12 and reconstructing an image. The computer 8 comprises a processor 9 and a storage section 10.

Figure 2:
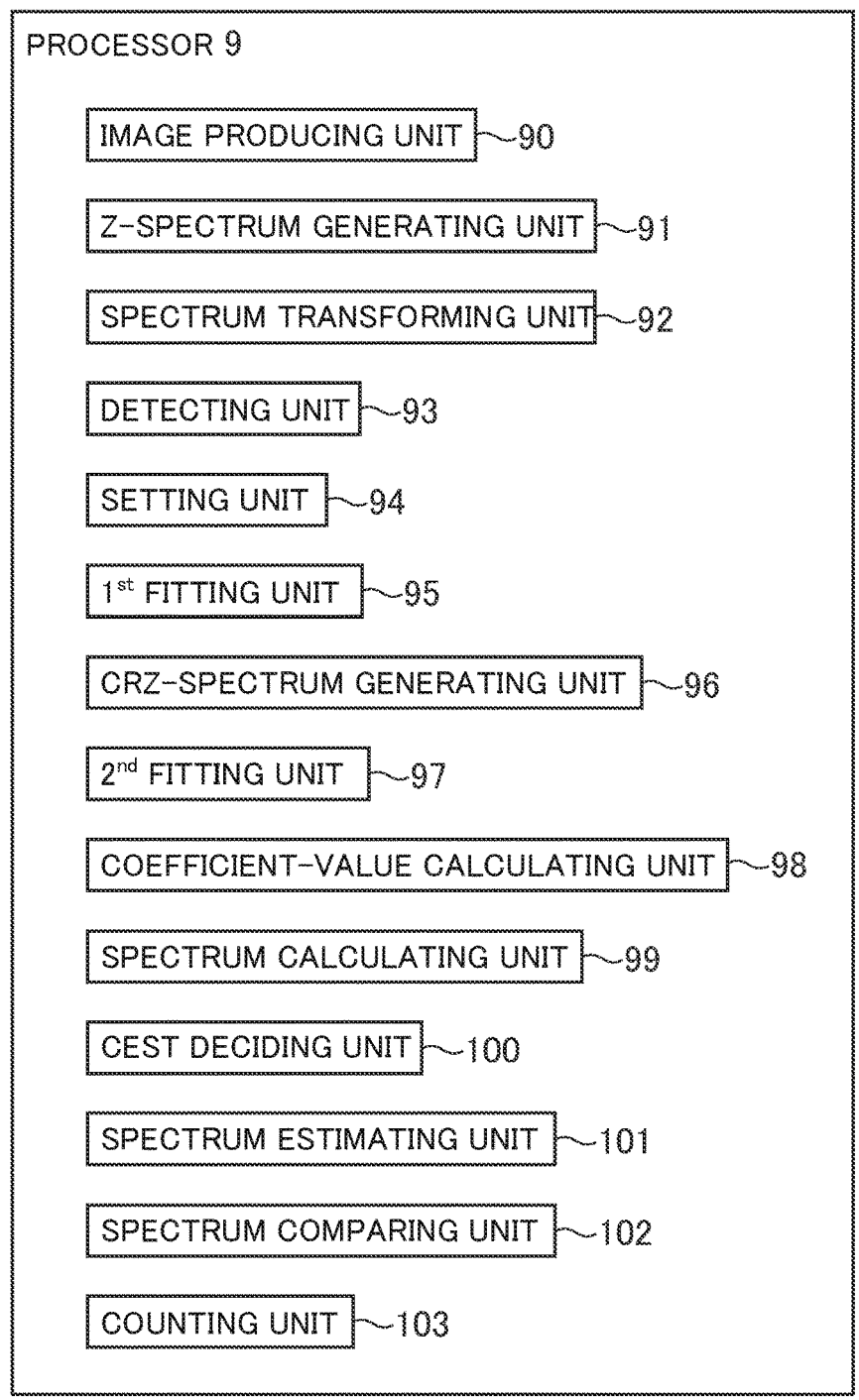
FIG. 2 is a diagram explaining units of a processor 9 implemented in the first embodiment.

The storage section 10 stores therein programs executed by processor 9, and the like. It should be noted that the storage section 10 may be a computer-readable non-transitory recording medium. The non-transitory recording medium that may be employed is a CD-ROM, for example. The processor 9 loads thereon a program stored in the storage section 10, and implements units for executing processing written in the program. FIG. 2 is a diagram explaining units of the processor 9 implemented in an embodiment. The processor 9 implements image producing unit 90 through counting unit 103, etc. by loading thereon programs stored in the storage section 10.

The image producing unit 90 produces an image based on data acquired by sequences $SE_1$ to $SE_{16}$ (see FIG. 11), which will be discussed later.

The Z-spectrum generating unit 91 generates a Z-spectrum based on an image obtained by the image producing unit 90.

The spectrum transforming unit 92 transforms the Z-spectrum into a CPE spectrum $F_{CPE}(\Delta\omega_a)$ (see FIGS. 9A and 9B, for example), which will be discussed later. The CPE spectrum $F_{CPE}(\Delta\omega_a)$ corresponds to the first spectrum.

The detecting unit 93 detects an offset frequency at which a signal component affected by CEST appears, based on the CPE spectrum.

The setting unit 94 sets the value of n, which represents the number of CEST terms. The first fitting unit 95 applies fitting using EQ. (16), which will be discussed later, to calculate the values of coefficients included in the CEST term. The CEST term will be discussed later.

The CRZ-spectrum generating unit 96 generates a spectrum (CRZ[CEST-removed Z]-spectrum, which will be discussed later), which is obtained by removing CEST components from the Z-spectrum. The CRZ-spectrum corresponds to the second spectrum.

The second fitting unit 97 applies fitting using EQ. (20), which will be discussed later, to calculate the values of coefficients ($b_0$, $b_1$, $b_2$, $\Delta\omega_0$) included in EQ. (20).

The coefficient-value calculating unit 98 calculates the values of coefficients included in a baseline term based on the values of the coefficients calculated by the second fitting unit 97. The baseline term will be discussed later.

The spectrum calculating unit 99 calculates a spectrum $F_{CPE\_n}(\Delta\omega_a)$ (see EQ. (21)), which will be discussed later. The spectrum $F_{CPE\_n}(\Delta\omega_a)$ corresponds to the third spectrum.

The CEST deciding unit 100 decides whether or not another signal component affected by CEST is included in the CPE spectrum $F_{CPE}(\Delta\omega_a)$ obtained by the spectrum transforming unit 92.

The spectrum estimating unit 101 estimates a Z-spectrum (ideal Z-spectrum) expressed by the sum of the baseline term and CEST terms.

The spectrum comparing unit 102 compares the ideal Z-spectrum estimated by the spectrum estimating unit 101 with the Z-spectrum generated by the Z-spectrum generating unit 91, and decides whether or not the Z-spectrum is reproduced by the ideal Z-spectrum.

The counting unit 103 counts the total number of offset frequencies detected by the detecting unit 93.

The processor 9 represents an example for configuring the image producing unit 90 through counting unit 103, and functions as these units by executing programs stored in the storage section 10. The first fitting unit 95 corresponds to the unit for obtaining information on the CEST component, and a combination of the CRZ-spectrum generating unit 96, second fitting unit 97, and coefficient-value calculating unit 98 corresponds to the unit for obtaining information on the baseline component.

The operating section 11 is operated by an operator to input several kinds of information to the computer 8. The display section 12 displays several kinds of information. The MR apparatus 1 is configured as described above.

Figure 3:
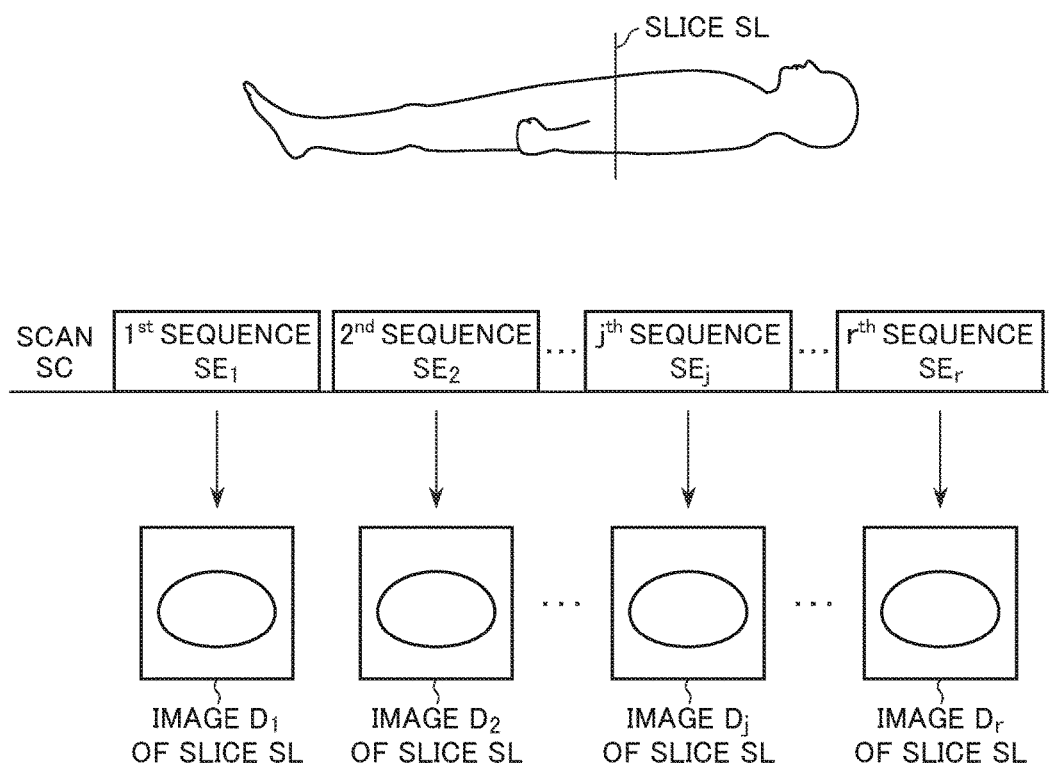
FIG. 3 is a diagram explaining a scan performed in the first embodiment.

FIG. 3 is a diagram explaining a scan performed in the first embodiment. A scan SC is a scan for obtaining an image of a slice SL using the CEST imaging technique. The scan SC performs a sequence $SE_k$ (k=1 to r) for obtaining an image $D_k$ in the slice SL. In the first embodiment, the sequence $SE_k$ is performed r times, so that r images $D_1$ to $D_r$ may be obtained by performing the scan SC.

Figure 4:
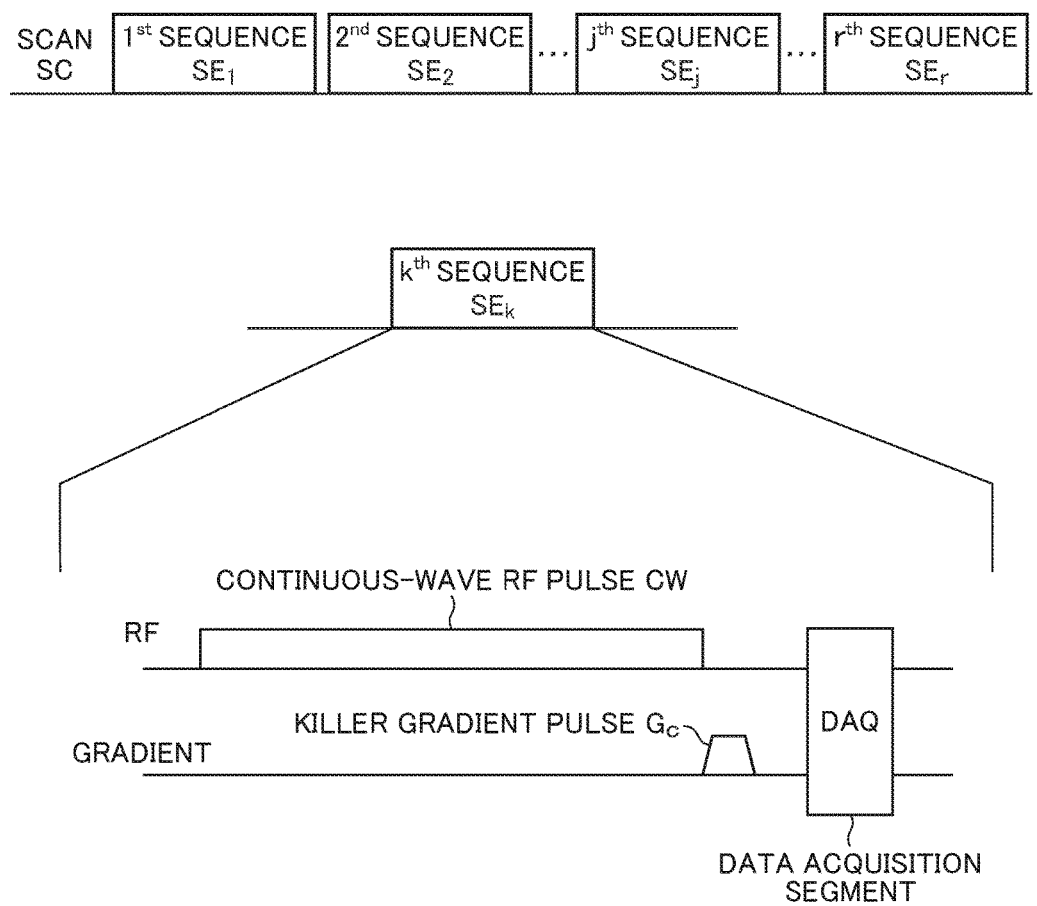
FIG. 4 is a diagram particularly showing a sequence $SE_k$ in the first embodiment.

FIG. 4 is a diagram particularly showing the sequence $SE_k$ in the first embodiment. The k-th sequence $SE_k$ comprises a continuous-wave RF pulse CW, a killer gradient pulse Gc for eliminating transverse magnetization, and a data acquisition segment DAQ for acquiring data by a single-shot technique. The frequency f[Hz] of the RF pulse CW is set to f=fk. After the continuous-wave RF pulse CW has been applied, the killer gradient pulse Gc is applied, and after the killer gradient pulse Gc has been applied, the data acquisition segment DAQ is performed.

The k-th sequence $SE_k$ is configured as described above. Denoting the frequency of the RF pulse CW in the sequences $SE_1$, $SE_2$, ..., $SE_r$ as f1, f2, ..., fr, respectively, these frequencies f1, f2, ..., fr are set to values different from one another.

In the first embodiment, the sequences $SE_1$ to $SE_r$ are performed to thereby obtain images $D_1$ to $D_r$, based on which a Z-spectrum is generated.

FIGS. 5A and 5B are diagrams explaining a Z-spectrum. FIG. 5A is a diagram schematically showing a waveform of the Z-spectrum. The horizontal axis for the Z-spectrum is an offset frequency $\Delta\omega_a$ representing an offset from the resonance frequency of water. $\Delta\omega_a$ is calculated such that $\Delta\omega_a = 2\pi(f-f_w)$ [rad/sec], where $f_w$ designates the resonance frequency of water.

As shown in FIG. 5A, the Z-spectrum has a CEST-induced signal decay appearing at a certain offset frequency $\Delta\omega_c$. Therefore, by isolating a signal component affected by CEST from the Z-spectrum, it is possible to quantitatively evaluate CEST.

FIG. 5B is a diagram showing the Z-spectrum, where a signal component P1 affected by CEST (referred to as "CEST component" hereinbelow) is separated from a signal component P2 unaffected by CEST (referred to as "baseline component" hereinbelow). It should be noted that the CEST component P1 actually has a downward peak at a frequency $\Delta\omega c$, although FIG. 5B shows the peak of the CEST component P1 upwardly inverted for convenience of explanation.

By isolating the CEST component P1 from the Z-spectrum, it is possible to quantitatively evaluate CEST. The Z-spectrum, however, contains a signal component P2 unaffected by CEST (baseline component), in addition to the signal component P1 affected by CEST (CEST component). Generally, the CEST component P1 and baseline component P2 may be approximated by a Lorentzian function. However, since the baseline component P2 has a larger peak than the CEST component P1 has, a ratio R (=P1/P2) between the CEST component P1 and baseline component P2 takes a small value in the proximity of the offset frequency $\Delta\omega_c$. Therefore, the peak of the CEST component P1 is buried in the baseline component P2, which sometimes makes it difficult to isolate the CEST component P1 from the Z-spectrum. Thus, in the first embodiment, the Z-spectrum is transformed into a spectrum suitable for extraction of the CEST component. Hereinbelow description will be made on a method of transforming a Z-spectrum into a spectrum suitable for extraction of a CEST component.

A Z-spectrum may be expressed by EQ. (1) given below:

$$Z = \frac{M_z^a(\Delta\omega_a)}{M_0^a} \quad (1)$$

where $\Delta\omega_a$: the offset frequency representing an offset from the resonance frequency of water;

$Mz^a$: the magnitude of longitudinal magnetization immediately before the data acquisition segment DAQ in the sequence $SE_k$ (FIG. 4); and $M_0$: the magnitude of magnetization immediately before the data acquisition segment DAQ in the case that the data acquisition segment DAQ is performed without applying an RF pulse WC and a killer gradient pulse Gc.

The sub/super-script "a" of a character denotes the ascription to free water.

Moreover, it has been demonstrated by Zaiss, et al. that the Z-spectrum may be approximated by EQ. (2) below (Zaiss M, et al., NMR Biomed., 26: 507-18 (2013)):

$$Z = \frac{M_z^a(\Delta\omega_a)}{M_0^a} \approx \frac{R_1^a \cos\theta}{R_{1\rho}} \quad (2)$$

$R_{1\rho}$ in EQ. (2) is a time constant for T1 recovery during application of an RF pulse, where it is demonstrated by Trott, et al. that the constant may be approximated by EQ. (3) below (Trott O, et al., J. Magn. Reson., 154: 157-60 (2002)):

$$R_{1\rho} \approx R_1^\alpha \cos^2\theta + R_2^\alpha \sin^2\theta + R_{ex} \sin^2\theta \quad (3)$$

The terms $\cos^2\theta$, $\sin^2\theta$, and $R_{ex}$ in EQ. (3) may be expressed by the equations below:

$$\cos^2\theta = \frac{\Delta\omega_a^2}{\Delta\omega_a^2 + \omega_1^2} \quad (3a)$$

$$\sin^2\theta = \frac{\omega_1^2}{\Delta\omega_a^2 + \omega_1^2} \quad (3b)$$

$$Rex = \frac{k_a \Delta\omega_c^2}{k^2 + \omega_1^2 + (\Delta\omega_a - \Delta\omega_c)^2} \quad (3b)$$

where
- $\omega_1$: the frequency [radian/sec] given from the intensity of the transmission magnetic field (B1 intensity) for an RF pulse WC;
- $\Delta\omega_c$: the offset frequency [radian/sec] at which a signal component affected by CEST appears;
- $k_a$: the time constant [Hz] of magnetization transfer from a free water pool to a CEST pool; and
- $k$: the time constant [Hz] of magnetization transfer from the CEST pool to the free water pool.

Now consider a function $F(\Delta\omega_a)$ representing $\Delta\omega_a^2$ as given below:

$$F(\Delta\omega_a) = \Delta\omega_a^2 \quad (4)$$

$F(\Delta\omega_a)$ in EQ. (4) is an even function, and $F(\Delta\omega_a)=0$ for $\Delta\omega_a=0$. Substituting EQ. (4) into EQS. (3a), (3b), and (3c), the equations below are given:

$$\cos^2\theta = \frac{F(\Delta\omega_a)}{F(\Delta\omega_a) + \omega_1^2} \quad (5a)$$

$$\sin^2\theta = \frac{\omega_1^2}{F(\Delta\omega_a) + \omega_1^2} \quad (5b)$$

$$Rex = \frac{k_a \Delta\omega_c^2}{k^2 + \omega_1^2 + F(\Delta\omega_a - \Delta\omega_c)} \quad (5c)$$

Next, consider a spectrum 1/Z, which is an inverse of the spectrum Z expressed by EQ. (1). From EQS. (1), (2), (3), and (5c), 1/Z may be expressed by the equation below:

$$\frac{1}{Z} \approx \frac{R_{1\rho}}{R_1^a \cos\theta} = \cos\theta + \frac{R_2^a}{R_1^a} * \frac{\sin^2\theta}{\cos\theta} + \frac{\Delta\omega_c^2 \frac{k_a}{R_1^a}}{k^2 + \omega_1^2 + F(\Delta\omega_a - \Delta\omega_c)} * \frac{\sin^2\theta}{\cos\theta} \quad (6)$$

Rearranging EQ. (6), EQ. (7) below is given:

$$\left(\frac{1}{Z} - \cos\theta\right)\frac{\cos\theta}{\sin^2\theta} \approx \frac{R_2^a}{R_1^a} + \frac{\Delta\omega_c^2 \frac{k_a}{R_1^a}}{k^2 + \omega_1^2 + F(\Delta\omega_a - \Delta\omega_c)} \quad (7)$$

Now consider a case in which $\Delta\omega_a$ is sufficiently smaller than $\omega_1$, that is, a case in which the following relationship holds:

$$\Delta\omega_a \gg \omega_1 \quad (8)$$

When EQ. (8) holds, EQ. (5a) may be approximated by the equation below:

$$\cos^2\theta = \frac{F(\Delta\omega_a)}{F(\Delta\omega_a) + \omega_1^2} \approx 1 \quad (9a)$$

Therefore, from EQ. (9a), $\cos\theta$ may be approximated by the equation below:

$$\cos\theta \approx 1 \quad (9a\text{-}1)$$

Moreover, when EQ. (8) holds, EQ. (5b) may be approximated by the equation below:

$$\sin^2\theta = \frac{\omega_1^2}{F(\Delta\omega_a) + \omega_1^2} \approx \frac{\omega_1^2}{F(\Delta\omega_a)} \quad (9b)$$

Rearranging EQ. (7) using EQS. (9a-1) and (9b), an approximate expression below is given:

$$\left(\frac{1}{Z} - 1\right)F(\Delta\omega_a) \approx \frac{R_2^a \omega_1^2}{R_1^a} + \frac{\omega_1^2 \Delta\omega_c^2 \frac{k_a}{R_1^a}}{k^2 + \omega_1^2 + F(\Delta\omega_a - \Delta\omega_c)} \approx \frac{R_2^a \omega_1^2}{R_1^a} + \frac{a_1}{a_2 + F(\Delta\omega_a - \Delta\omega_c)} \quad (10)$$

where $$a_1 = \omega_1^2 \Delta\omega_c^2 \frac{k_a}{R_1^a} \quad (10a)$$

$$a_2 = k^2 + \omega_1^2 \quad (10b)$$

When $\Delta\omega_a \gg \omega_1$ holds (see EQ. (8)), an approximate expression of EQ. (10) may be given. The first term $R_2^a \omega_1^2 / R_1^a$ on the right side is a term representing a relaxation time in a free water pool. The second term on the right side is a term representing the CEST component (signal component affected by CEST), which will be referred to as "CEST term" hereinbelow. The CEST term is expressed by a Lorentzian function with an intensity of $a_1$, a width of $a_2$, and a position of $\Delta\omega_c$. Therefore, it can be seen that the CEST component may be extracted as a peak expressed by the Lorentzian function. Accordingly, a spectrum expressed by EQ. (10) will be referred to as CPE (CEST Peak Extraction) spectrum in the first embodiment.

Representing the CPE spectrum as $F_{CPE}(\Delta\omega_a)$, it may be expressed by the equation below:

$$F_{CPE}(\Delta\omega_a) = \left(\frac{1}{Z} - 1\right) F(\Delta\omega_a) \quad (11)$$

Moreover, from EQS. (10) and (11), an approximate expression of the CPE spectrum $F_{CPE}(\Delta\omega_a)$ may be represented by the expression below:

$$F_{CPE}(\Delta\omega_a) \approx \frac{R_2^a \omega_1^2}{R_1^a} + \frac{a_1}{a_2 + F(\Delta\omega_a - \Delta\omega_c)} \quad (12)$$

It should be noted that in EQ. (3) used in the preceding description, a model by Trott, et al. is assumed. The model by Trott, et al. is a two-pool model wherein CEST brought about between two pools (for example, free water and NH) is taken account of. In actual biological tissue, however, magnetization transfer (MT) occurring between bound water and free water must be taken account of. Now represent a spectrum expressing an effect of MT (magnetization transfer) occurring between bound water and free water as $Z_{MT}$, and it is assumed that the spectrum $Z_{MT}$ may be expressed by an equation in which the Lorentzian function is subtracted from a constant. In this case, the spectrum $Z_{MT}$ may be expressed by the equation below.

$$Z_{MT} = b_0 - \frac{b_1}{b_2 + F(\Delta\omega_a - \Delta\omega_0)} \quad (13)$$

In EQ. (13), $\Delta\omega_0$ represents an error in frequency. The first term ($b_0$) on the right side in EQ. (13) is a constant term, and the second term on the right side is a term of the Lorentzian function. Now replacing Z on the right side in EQ. (11) with $Z_{MT}$, it is further assumed that $\Delta\omega_0$ in EQ. (13) is sufficiently small and may be expressed as $\Delta\omega_0=0$. In this case, EQ. (11) after replacing Z with $Z_{MT}$ and EQ. (13) after assuming $\Delta\omega_0=0$ are used to give the equation below:

$$\left(\frac{1}{Z_{MT}} - 1\right) F(\Delta\omega_a) = \quad (14)$$
$$\frac{b_1}{b_0^2} + \left(\frac{1}{b_0} - 1\right) F(\Delta\omega_a) - \left(\frac{b_1}{b_0^2}\right) \frac{(b_2 - b_1/b_0)}{(b_2 - b_1/b_0) + F(\Delta\omega_0)}$$

The third term on the right side in EQ. (14) is small enough to be neglected. Therefore, EQ. (14) may be approximated by the equation below.

$$\left(\frac{1}{Z_{MT}} - 1\right) F(\Delta\omega_a) \approx \frac{b_1}{b_0^2} + \left(\frac{1}{b_0} - 1\right) F(\Delta\omega_a) \quad (15)$$

The second term on the right side in EQ. (15) is a term representing a signal component affected by MT occurring between free water and bound water (which will be referred to as "MT term" hereinbelow).

While the two-pool model takes account of only one CEST peak, a plurality of CEST peaks may appear in some cases. Then, taking account of n CEST terms and assuming that a linear combination of the CEST terms and MT term holds, the CPE spectrum $F_{CPE}(\Delta\omega_a)$ may be approximated based on EQS. (12) and (15) by the equations below:

$$F_{CPE}(\Delta\omega_a) \approx \underbrace{c_0 + c_{MT} F(\Delta\omega_a)}_{\text{Baseline term}} + \underbrace{\Sigma_n F_{L,n}(\Delta\omega_a)}_{\text{CEST term}} \quad (16)$$

where $$c_0 = \frac{b_1}{b_0^2} \approx \frac{R_2^a \omega_1^2}{R_1^a} \quad (16a)$$

$$c_{MT} = \frac{1}{b_0} - 1 \quad (16b)$$

$$F_{L,n}(\Delta\omega_a) = \frac{a_{1,n}}{a_{2,n} + F(\Delta\omega_a - \Delta\omega_{c,n})} \quad (16c)$$

Note that $\Delta\omega_a \gg \omega_1$. The sum of the first and second terms on the right side in EQ. (16) are terms representing the baseline component (signal component unaffected by CEST). The terms will be referred to together as baseline term hereinbelow. Moreover, $F_{L,n}(\Delta\omega_a)$ in the third term on the right side in EQ. (16) represents an n-th CEST term. Therefore, it can be seen from EQ. (16) that the CPE spectrum $F_{CPE}(\Delta\omega_a)$ may be approximated by a function comprising the baseline term and n CEST terms. The function comprising the baseline term and n CEST terms corresponds to the first function.

The baseline term in EQ. (16) is expressed by the sum of a constant term $c_0$ and an MT term $c_{MT} F(\Delta\omega_a)$. $F(\Delta\omega_a)$ in the MT term is not a Lorentzian function but an even function defined by EQ. (4). Therefore, it can be seen that the baseline component (signal component unaffected by CEST) included in the CPE spectrum $F_{CPE}(\Delta\omega_a)$ may be approximated by an even function.

Figure 6A:
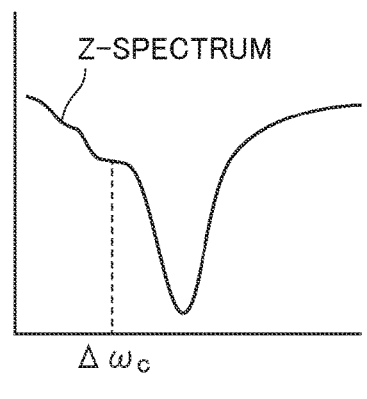
FIGS. 6A-6D are diagrams for explaining a difference between a Z-spectrum and a CPE spectrum.
Figure 6B:
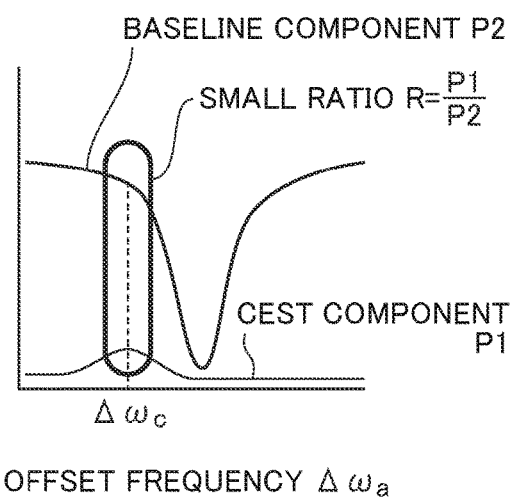

FIGS. 6A-6D are diagrams for explaining a difference between the Z-spectrum and CPE spectrum. FIG. 6A is a schematic diagram of the waveform of the Z-spectrum, and FIG. 6B is a diagram showing the Z-spectrum wherein the CEST component P1 is separated from the baseline component P2.

As described with reference to FIGS. 5A and 5B, the baseline component P2 in the Z-spectrum is approximated by a Lorentzian function having a large peak. Since the ratio R (=P1/P2) between the CEST component P1 and baseline component P2 thus takes a small value in the vicinity of the frequency $\Delta\omega_c$, the peak of the CEST component P1 is buried in the baseline component P2, which sometimes makes it difficult to isolate the signal component P1 affected by CEST from the Z-spectrum.

Figure 6C:
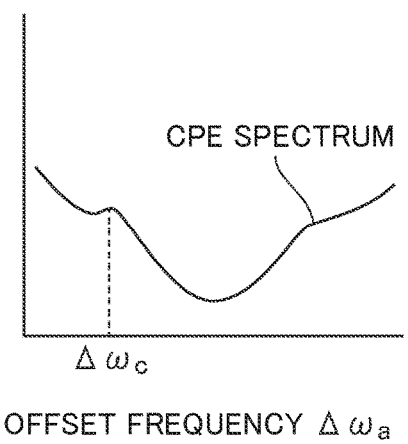
Figure 6D:
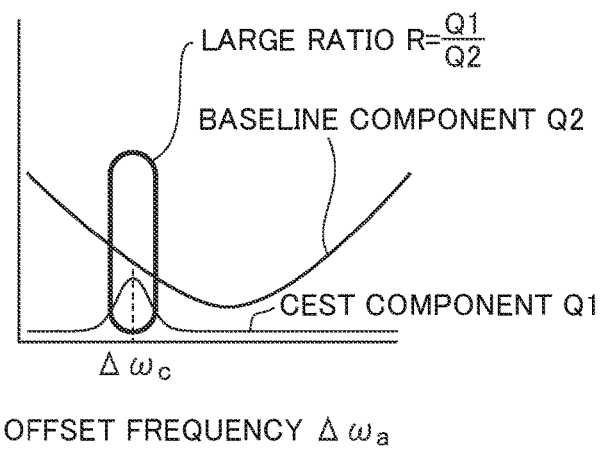

On the other hand, FIG. 6C is a schematic diagram of the waveform of the CPE spectrum, and FIG. 6D is a diagram showing the CPE spectrum wherein the CEST component Q1 is separated from the baseline component Q2. As mentioned in the explanation of EQ. (16), the baseline component of the CPE spectrum may be approximated by an even function. Since the baseline component Q2 of the CPE spectrum thus has no large peak caused by the Lorentzian function, the ratio R (=Q1/Q2) between the CEST component Q1 and baseline component Q2 may be increased in the vicinity of the frequency $\Delta\omega_c$. The CPE spectrum thus yields a ratio R larger than that in the Z-spectrum, which makes it easier to isolate the CEST component Q1 from the CPE spectrum.

While FIGS. 6A-6D show a case of the Z-spectrum containing only one CEST component for simplifying explanation, a plurality of CEST components may be sometimes contained in the Z-spectrum. Even in the case that a plurality of CEST components are contained in the Z-spectrum, the effect of the baseline component may be reduced by transforming the Z-spectrum into a CPE spectrum. Therefore, even in the case that a plurality of CEST components are contained in the Z-spectrum, it may be made easier to isolate each of the plurality of CEST components from the CPE spectrum by transforming the Z-spectrum into a CPE spectrum.

In the first embodiment, the Z-spectrum is transformed into a CPE spectrum, which is used to produce a CEST image. Now a method of producing the CEST image using the CPE spectrum will be particularly described.

Figure 7:
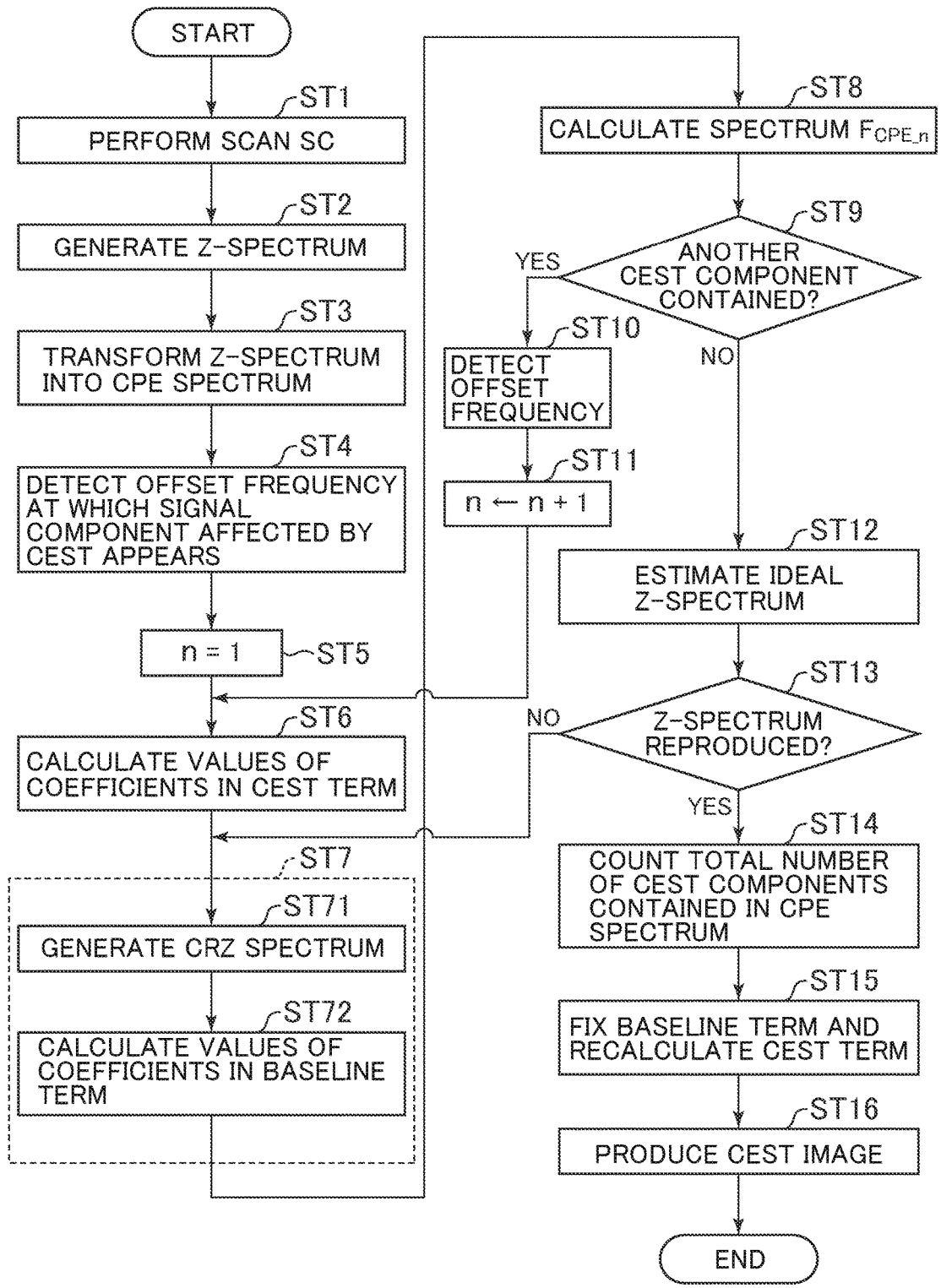
FIG. 7 is a chart showing the flow for producing a CEST image.

FIG. 7 is a chart showing the flow for producing a CEST image. At Step ST1, a scan SC (see FIG. 4) is performed. In the scan SC, sequences $SE_1$ to $SE_r$ are performed. The image producing unit 90 (see FIG. 2) produces images $D_1$ to $D_r$ (see FIG. 3) for a slice SL based on data acquired by the sequences $SE_1$ to $SE_r$. Since the frequency of the RF pulse CW is set to a mutually different value among the sequences $SE_1$ to $SE_r$, images $D_1$ to $D_r$ with r varying frequencies of the RF pulse may be obtained by performing the sequences $SE_1$ to $SE_r$. After performing the sequences $SE_1$ to $SE_r$, the flow goes to Step ST2.

Figure 8:
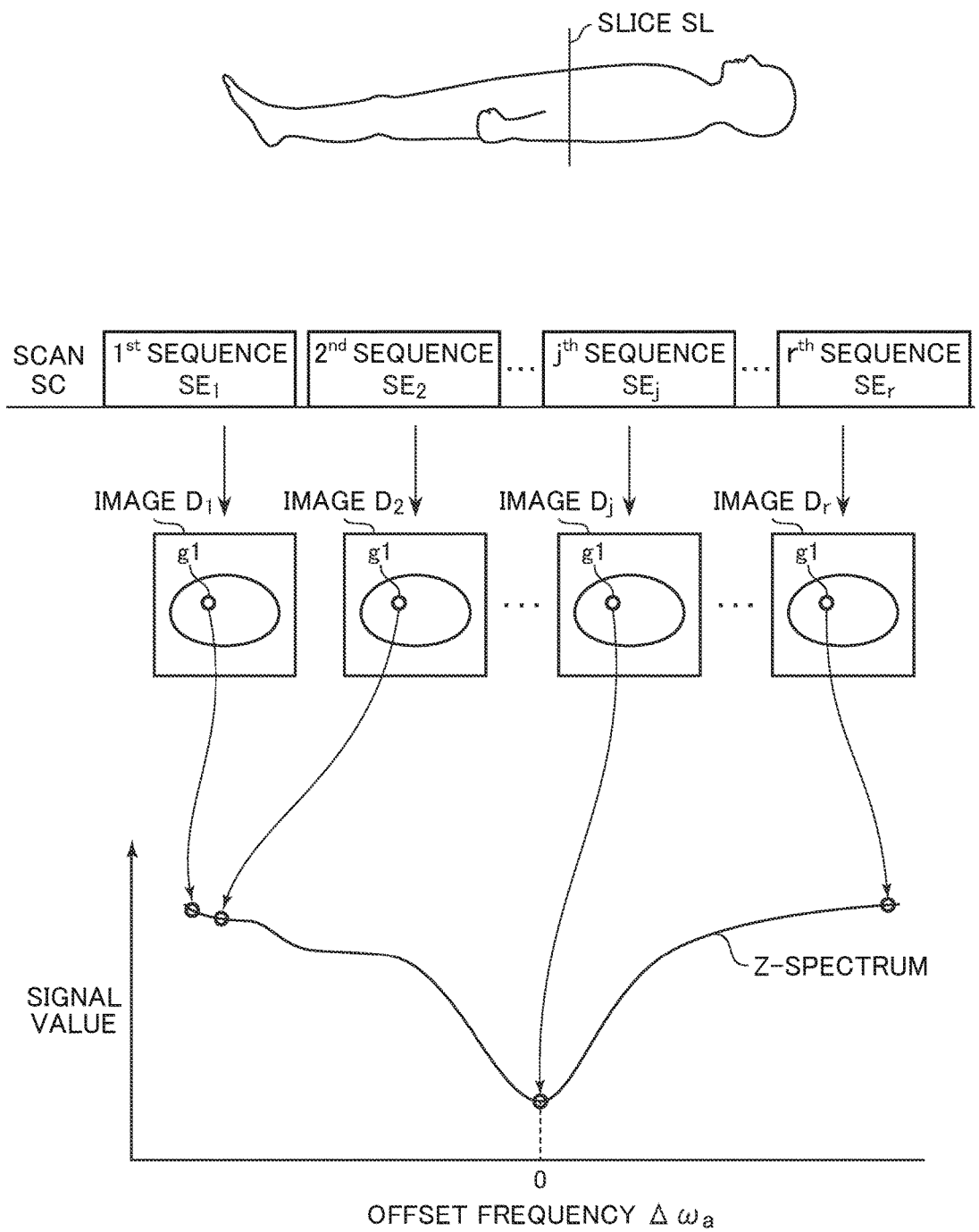
FIG. 8 is a diagram schematically showing a Z-spectrum.

At Step ST2, the Z-spectrum generating unit 91 (see FIG. 2) generates a Z-spectrum. FIG. 8 schematically shows the Z-spectrum. The Z-spectrum generating unit 91 extracts a pixel at the same position in the images $D_1$ to $D_r$, and generates a Z-spectrum representing a relationship between an offset frequency $\Delta\omega_a$, which represents an offset of the frequency from the resonance frequency of water, and a signal value. FIG. 8 shows a Z-spectrum for a pixel g1 at the same position in the images $D_1$ to $D_r$, and those for other pixels are generated as well. After generating the Z-spectrum, the flow goes to Step ST3.

Figure 9A:
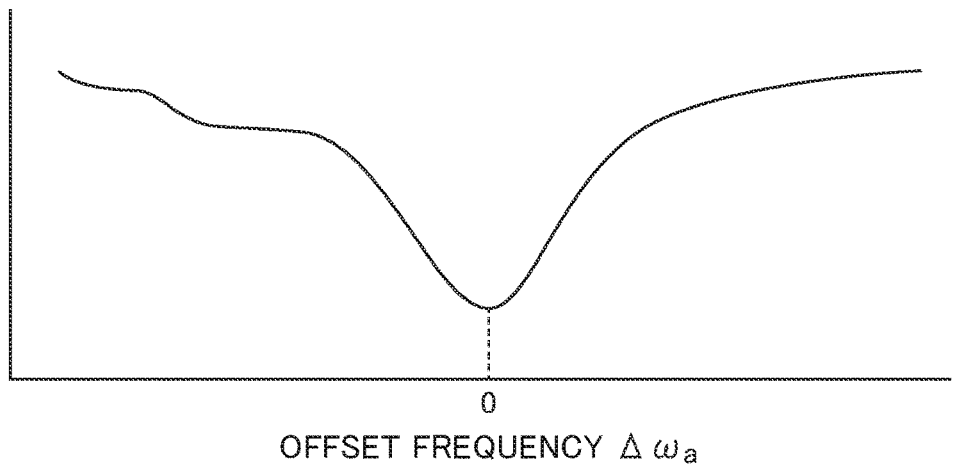
FIGS. 9A and 9B are diagrams schematically showing a CPE spectrum $F_{CPE}(\Delta\omega_a)$.
Figure 9B:
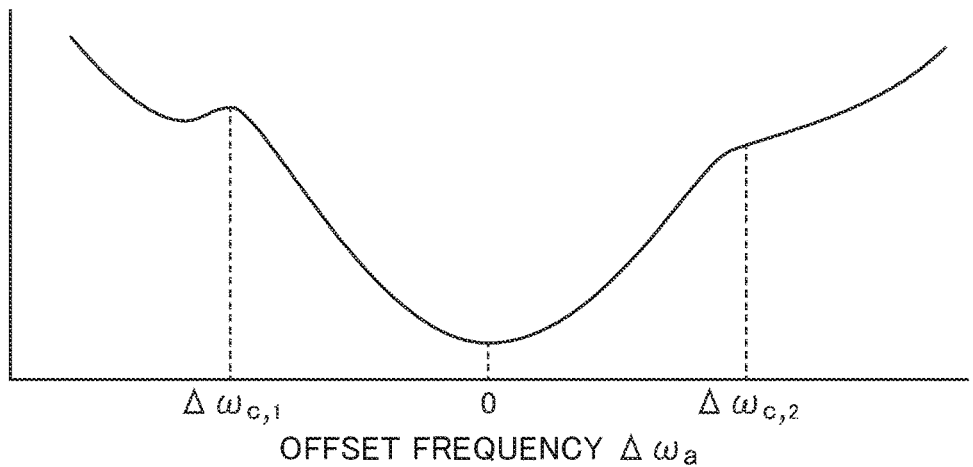

At Step ST3, the spectrum transforming unit 92 (see FIG. 2) transforms the Z-spectrum into a CPE spectrum $F_{CPE}(\Delta\omega_a)$ using EQ. (11). FIGS. 9A and 9B schematically show the CPE spectrum $F_{CPE}(\Delta\omega_a)$. It is assumed here that the CPE spectrum $F_{CPE}(\Delta\omega_a)$ contains signal components affected by CEST (CEST component) at offset frequencies $\Delta\omega_{c,1}$ and $\Delta\omega_{c,2}$. While the unit of the offset frequency is [rad/sec], it may be converted from [rad/sec] into [ppm]. It is assumed here that the unit of the offset frequency is converted into [ppm]. It should be noted that the offset frequency is still denoted by the symbol "$\Delta\omega_a$" after converting the unit of the offset frequency from [rad/sec] to [ppm] for convenience of explanation. After transforming the Z-spectrum into the CPE spectrum $F_{CPE}(\Delta\omega_a)$, the flow goes to Step ST4.

At Step ST4, the detecting unit 93 (see FIG. 2) detects an offset frequency at which a signal component affected by CEST (CEST component) appears from within the CPE spectrum $F_{CPE}(\Delta\omega_a)$. A method of detecting the offset frequency at which the CEST component appears will be described hereinbelow.

Since $F(\Delta\omega_a)$ included in the baseline term in EQ. (16) is expressed by a quadric function of $\Delta\omega_a$ (see EQ. (4)), it can be seen that the baseline component of the CPE spectrum $F_{CPE}(\Delta\omega_a)$ may be approximated by a quadric function. Therefore, the offset frequency at which the CEST component appears may be detected by comparing the CPE spectrum $F_{CPE}(\Delta\omega_a)$ with the quadric function, and determining an offset frequency at which the difference between the CPE spectrum $F_{CPE}(\Delta\omega_a)$ and quadric function is increased. It is assumed here that the CPE spectrum $F_{CPE}(\Delta\omega_a)$ has a largest difference from the quadric function at the offset frequency $\Delta\omega_{c,1}$. Therefore, the detecting unit 93 detects the offset frequency $\Delta\omega_{c,1}$ as the offset frequency at which the CEST component appears. It is assumed here that the detected value of $\Delta\omega_{c,1}$ is $\Delta\omega_{a1}$. Therefore, the detected value of $\Delta\omega_{c,1}$ is given by the equation below:

$$\Delta\omega_{c,1} = \Delta\omega_{a1} \tag{16d}$$

After detecting the offset frequency $\Delta\omega_{c,1} = \Delta\omega_{a1}$, the flow goes to Step ST5. At Step ST5, the setting unit 94 (see FIG. 2) sets n, which denotes the number of the CEST terms included in the approximate expression EQ. (16) of the CPE spectrum $F_{CPE}(\Delta\omega_a)$, to an initial value of one. When n=1 is set, EQ. (16) is given by the equation below.

$$F_{CPE}(\Delta\omega_a) \approx \underbrace{c_0 + c_{MT}F(\Delta\omega_a)}_{Baseline\ term} + \underbrace{F_{L,1}(\Delta\omega_a)}_{CEST\ term} \tag{17}$$

where $$c_0 = \frac{b_1}{b_0^2} \approx \frac{R_2^2\omega_1^2}{R_1^a} \tag{17a}$$

$$c_{MT} = \frac{1}{b_0} - 1 \tag{17b}$$

$$F_{L,1}(\Delta\omega_a) = \frac{a_{1,1}}{a_{2,1} + F(\Delta\omega_a - \Delta\omega_{c,1})} \tag{17c}$$

The coefficients ($c_0$, $c_{MT}$) for the baseline term in EQ. (17), and the coefficients ($a_{1,1}$, $a_{2,1}$, $\Delta\omega_{c,1}$) for the CEST term $F_{L,1}(\Delta\omega_a)$ in EQ. (17c) are unknown. After setting n=1, the flow goes to Step ST6.

At Step ST6, the first fitting unit 95 (see FIG. 2) applies fitting so that an error between the CPE spectrum $F_{CPE}(\Delta\omega_a)$ determined according to EQ. (11), and EQ. (17) is minimized, and calculates the values of the coefficients ($a_{1,1}$, $a_{2,1}$, $\Delta\omega_{c,1}$) for the CEST term $F_{L,1}(\Delta\omega_a)$ and the values of the coefficients ($c_0$, $c_{MT}$) for the baseline term in EQ. (17) when the error is minimized. In applying fitting, the first fitting unit 95 first sets initial values for the coefficients ($a_{1,1}$, $a_{2,1}$, $\Delta\omega_{c,1}$), and initial values for the coefficients ($c_0$, $c_{MT}$). For example, the initial value for the coefficient $\Delta\omega_{c,1}$ is set to the value of the offset frequency $\Delta\omega_{c,1}$ detected at Step ST4, that is, $\Delta\omega_{c,1} = \Delta\omega_{a1}$ (see EQ. (16d)). Moreover, the initial values for the other coefficients $a_{1,1}$, $a_{2,1}$, $c_0$, and $c_{MT}$ may be calculated using the feature quantity of the CPE spectrum $F_{CPE}(\Delta\omega_a)$ (the maximum value, minimum value, or the like, of the CPE spectrum). After setting the initial values for the coefficients, the first fitting unit 95 changes the values of the coefficients on the basis of the initial values, and calculates values of the coefficients ($a_{1,1}$, $a_{2,1}$, $\Delta\omega_{c,1}$) and coefficients ($c_0$, $c_{MT}$) when an error between the CPE spectrum $F_{CPE}(\Delta\omega_a)$ determined according to EQ. (11), and EQ. (17) is minimized. FIG. 10 shows the values of the coefficients calculated by fitting. In FIG. 10, they are shown as ($c_0$, $c_{MT}$)=($c_0(1)$, $c_{MT}(1)$), and ($a_{1,1}$, $a_{2,1}$, $\Delta\omega_{c,1}$)=($a_{1,1}(1)$, $a_{2,1}(1)$, $\Delta\omega_{c,1}(1)$).

It should be noted that values of the coefficients ($c_0$, $c_{MT}$) for the baseline term may be calculated by fitting, in addition to the values of the coefficients for the CEST term $F_{L,1}(\Delta\omega_a)$. However, the CPE spectrum $F_{CPE}(\Delta\omega_a)$ has a baseline component suppressed more than that of the Z-spectrum (see FIGS. 6A-6D). Therefore, when the coefficients ($c_0$, $c_{MT}$) for the baseline term are determined by fitting the CPE spectrum $F_{CPE}(\Delta\omega_a)$ by the approximate expression EQ. (17), an estimation error for the coefficients ($c_0$, $c_{MT}$) may be possibly increased. Accordingly, in the first embodiment, the coefficients ($c_0$, $c_{MT}$) are recalculated so that their estimation error is decreased. For recalculating the coefficients ($c_0$, $c_{MT}$), the flow goes to Step ST7.

Step ST7 comprises two steps ST71 and ST72. The steps ST71 and ST72 will be described hereinbelow.

At Step ST71, the CRZ-spectrum generating unit 96 (see FIG. 2) generates a spectrum, which is obtained by removing CEST components from the Z-spectrum. The spectrum obtained by removing CEST components from the Z-spectrum will be referred to as CRZ-spectrum (CEST-Removed Z-spectrum) hereinbelow. Denoting the CRZ-spectrum as "$Z_{CRZ}$," the CRZ-spectrum $Z_{CRZ}$ may be expressed using the Z-spectrum by the equation below:

$$\frac{1}{Z_{CRZ}} = \frac{1}{Z} - \frac{\sum_n F_{L,n}(\Delta\omega_a)}{F(\Delta\omega_a) + \delta(\Delta\omega_a)} \quad (18)$$

where $$\delta(\Delta\omega_a) = \frac{0.25}{0.25 + F(\Delta\omega_a)} \quad (18a)$$

It should be noted that $\delta(\Delta\omega_a)$ is a function introduced so that the denominator of the second term on the right side in EQ. (18) is non-zero at $\Delta\omega_a=0$. Since n=1 here, EQ. (18) is expressed by the equation below:

$$\frac{1}{Z_{CRZ}} = \frac{1}{Z} - \frac{F_{L,1}(\Delta\omega_a)}{F(\Delta\omega_a) + \delta(\Delta\omega_a)} \quad (19)$$

$$F_{L,1}(\Delta\omega_a) = \frac{a_{1,1}}{a_{2,1} + F(\Delta\omega_a - \Delta\omega_{c,1})} \quad (19a)$$

Z in EQ. (19) has been determined at Step ST2. The coefficients ($a_{1,1}$, $a_{2,1}$, $\Delta\omega_{c,1}$) for $F_{L,1}(\Delta\omega_a)$ in EQ. (19a) have been calculated as ($a_{1,1}$, $a_{2,1}$, $\Delta\omega_{c,1}$)=($a_{1,1}(1)$, $a_{2,1}(1)$, $\Delta\omega_{c,1}(1)$) at Step ST6, as shown in FIG. 10. Therefore, from EQ. (19), a CRZ-spectrum $Z_{CRZ}$ in which the signal component affected by CEST (CEST component) is removed may be generated. After generating the CRZ-spectrum $Z_{CRZ}$, the flow goes to Step ST72.

At Step ST72, the values of the coefficients ($c_0$, $c_{MT}$) for the baseline term in EQ. (17) are calculated based on the CRZ-spectrum $Z_{CRZ}$ generated at Step ST71. A method of finding the values of the coefficients ($c_0$, $c_{MT}$) will be described hereinbelow.

The CRZ-spectrum $Z_{CRZ}$ represents a spectrum obtained by removing CEST components from the Z-spectrum. Therefore, the CRZ-spectrum $Z_{CRZ}$ may be considered to mainly represent a signal component affected by MT occurring between free water and bound water, rather than a signal component affected by CEST. A spectrum representing the signal component affected by MT occurring between free water and bound water is expressed by the spectrum $Z_{MT}$ in EQ. (13). Therefore, the CRZ-spectrum $Z_{CRZ}$ may be approximated using the spectrum $Z_{MT}$ by the equation below:

$$Z_{CRZ} \approx Z_{MT} = \underbrace{b_0}_{\text{Constant term}} - \underbrace{\frac{b_1}{b_2 + F(\Delta\omega_a - \Delta\omega_0)}}_{\text{Lorentzian function term}} \quad (20)$$

From EQ. (20), it can be seen that the CRZ-spectrum $Z_{CRZ}$ may be approximated by a function expressed by the sum of the constant term ($b_0$) and Lorentzian function term.

The function expressed by the sum of the constant term ($b_0$) and Lorentzian function term corresponds to the second function.

The second fitting unit 97 (see FIG. 2) applies fitting so that an error between the CRZ-spectrum $Z_{CRZ}$ and EQ. (20) is minimized, and calculates values of the coefficients ($b_0$, $b_1$, $b_2$, $\Delta\omega_0$) in EQ. (20) with an error minimized. In applying fitting, the second fitting unit 97 first calculates initial values for the coefficients ($b_0$, $b_1$, $b_2$, $\Delta\omega_0$). The initial values for the coefficients ($b_0$, $b_1$, $b_2$, $\Delta\omega_0$) may be calculated based on the values ($c_0$, $c_{MT}$)=($c_0(1)$, $c_{MT}(1)$) for the baseline term calculated at Step ST6, for example. After calculating the initial values for the coefficients ($b_0$, $b_1$, $b_2$, $\Delta\omega_0$), the second fitting unit 97 changes the values of the coefficients ($b_0$, $b_1$, $b_2$, $\Delta\omega_0$) on the basis of the initial values, and calculates values of the coefficients ($b_0$, $b_1$, $b_2$, $\Delta\omega_0$) with an error between the CRZ-spectrum $Z_{CRZ}$ and EQ. (20) minimized. FIG. 11 shows the values of the coefficients ($b_0$, $b_1$, $b_2$, $\Delta\omega_0$) calculated by fitting. In FIG. 11, the calculated values of the coefficients ($b_0$, $b_1$, $b_2$, $\Delta\omega_0$) are shown as ($b_0$, $b_1$, $b_2$, $\Delta\omega_0$)=($b_0(1)$, $b_1(1)$, $b_2(1)$, $\Delta\omega_0(1)$).

After determining these values of the coefficients, the coefficient-value calculating unit 98 (see FIG. 2) substitutes ($b_0$, $b_1$)=($b_0(1)$, $b_1(1)$) into EQ. (17a) to calculate $c_0$. The coefficient-value calculating unit 98 also substitutes $b_0=b_0(1)$ into EQ. (17b) to calculate $c_{MT}$. Thus, values of the coefficients ($c_0$, $c_{MT}$) for the baseline term in EQ. (17) may be calculated. FIG. 12 shows calculated values of the coefficients ($c_0$, $c_{MT}$). In FIG. 12, they are shown as ($c_0$, $c_{MT}$)=($c_0(1)'$, $c_{MT}(1)'$). After determining these values, the flow goes to Step ST8.

At Step ST8, the spectrum calculating unit 99 (see FIG. 2) calculates a spectrum $F_{CPE\_n}(\Delta\omega_a)$, which is expressed by the sum of the baseline term $c_0+c_{MT}F(\Delta\omega_a)$ and CEST term $\Sigma_n F_{L,n}(\Delta\omega_a)$. The spectrum $F_{CPE\_n}$ may be defined by the equations below:

$$F_{CPE\_n}(\Delta\omega_a) = \underbrace{c_0 + c_{MT}F(\Delta\omega_a)}_{\text{Baseline term}} + \underbrace{\sum_n F_{L,n}(\Delta\omega_a)}_{\text{CEST term}} \quad (21)$$

Since n=1 is set at Step ST5, EQ. (21) is given by the equation below.

$$F_{CPE\_1}(\Delta\omega_a) = \underbrace{c_0 + c_{MT}F(\Delta\omega_a)}_{\text{Baseline term}} + \underbrace{F_{L,1}(\Delta\omega_a)}_{\text{CEST term}} \quad (22)$$

where $$F_{L,1}(\Delta\omega_a) = \frac{a_{1,1}}{a_{2,1} + F(\Delta\omega_a - \Delta\omega_{c,1})} \quad (22c)$$

Figure 13:
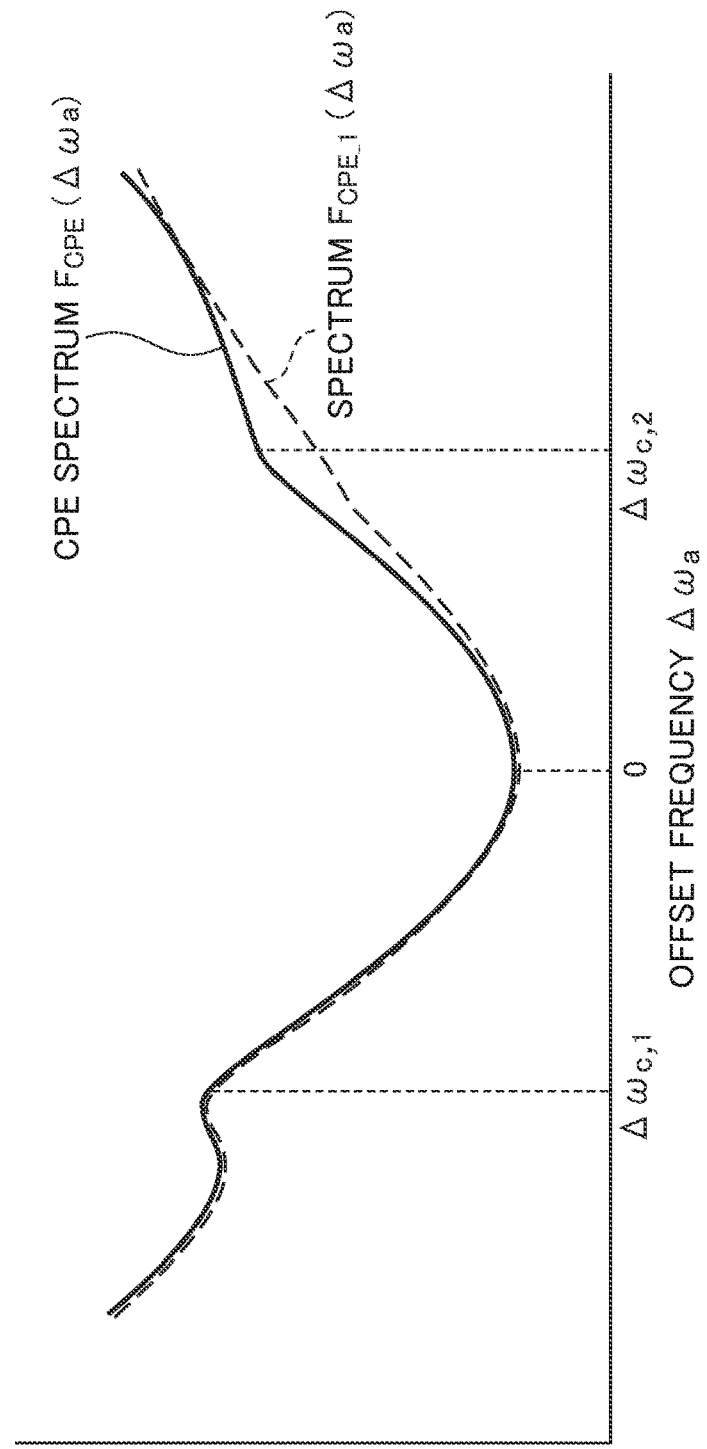
FIG. 13 is a diagram schematically showing a spectrum $F_{CPE\_1}(\Delta\omega_a)$.

The coefficients ($c_0$, $c_{MT}$) for the baseline term in EQ. (22) have been calculated as ($c_0$, $c_{MT}$)=($c_0(1)'$, ($c_{MT}(1)'$) at Step ST72 (see FIG. 12). Moreover, the coefficients ($a_{1,1}$, $a_{2,1}$, $\Delta\omega_{c,1}$) for the CEST term $F_{L,1}(\Delta\omega_a)$ in EQ. (22c) have been calculated as ($a_{1,1}$, $a_{2,1}$, $\Delta\omega_{c,1}$)=($a_{1,1}(1)$, $a_{2,1}(1)$, $\Delta\omega_{c,1}(1)$) at Step ST6 (see FIG. 12). Therefore, by substituting these values of the coefficients into EQS. (22) and (22c), the spectrum $F_{CDE\_1}(\Delta\omega_a)$ may be calculated. FIG. 13 schematically shows the spectrum $F_{CPE\_1}(\Delta\omega_a)$. In FIG. 13, the CPE spectrum $F_{CPE}(\Delta\omega_a)$, in addition to the spectrum $F_{CPE\_1}(\Delta\omega_a)$, is shown for comparison. It can be seen that the spectrum $F_{CPE\_1}(\Delta\omega_a)$ has a waveform sufficiently close to the CPE spectrum $F_{CPE}(\Delta\omega_a)$ in the vicinity of the offset frequency $\Delta\omega_{c,1}$. After calculating the spectrum $F_{CPE\_1}(\Delta\omega_a)$, the flow goes to Step ST9.

At Step ST9, the CEST deciding unit 100 (see FIG. 2) decides whether or not another CEST component different from the CEST component expressed by the CEST term $F_{L,1}(\Delta\omega_a)$ (see EQ. (22c)) is contained in the CPE spectrum $F_{CPE}(\Delta\omega_a)$.

Figure 14:
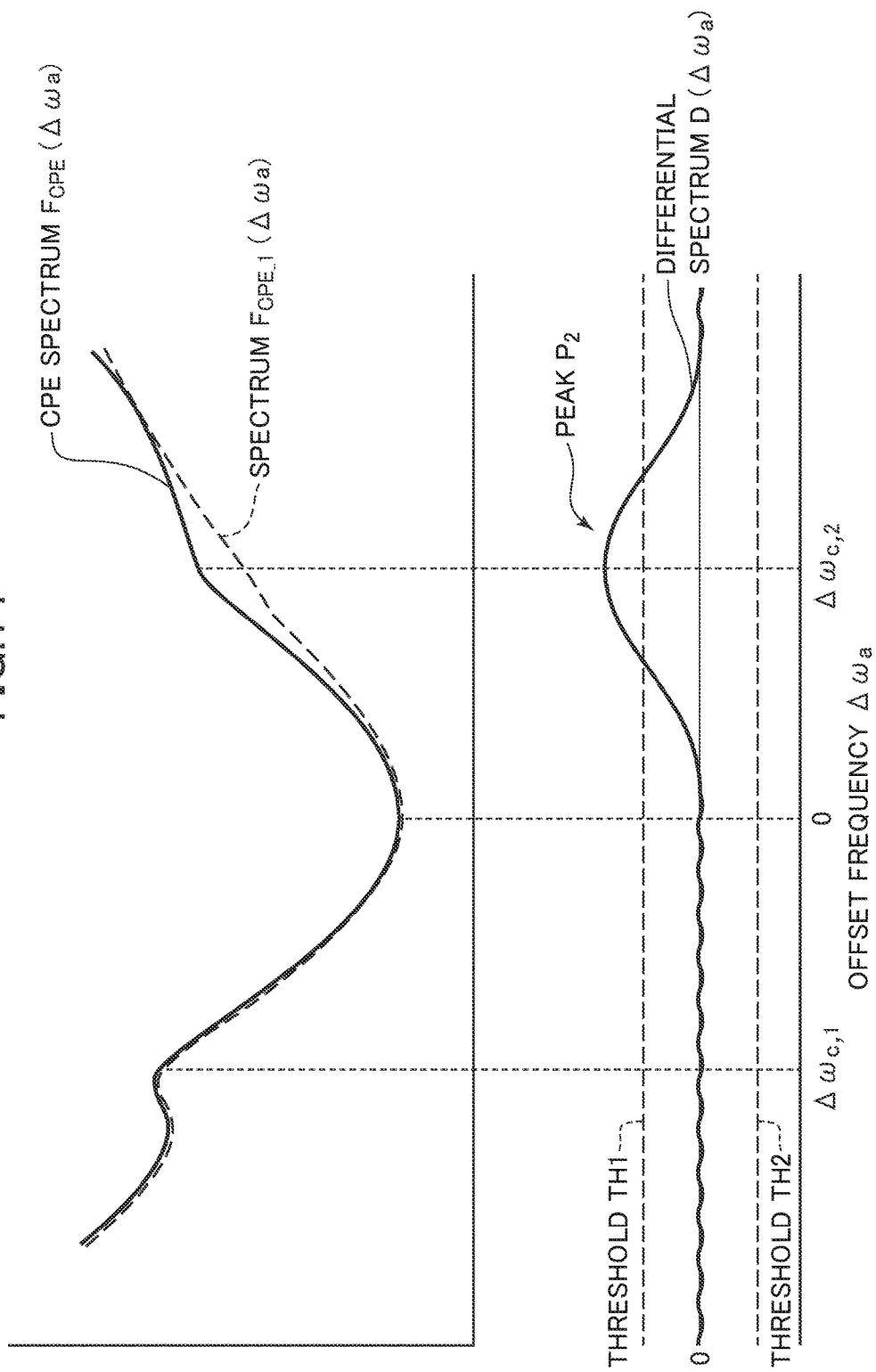
FIG. 14 is a diagram explaining a method of deciding whether or not another CEST component is contained in the CPE spectrum $F_{CPE}(\Delta\omega_a)$.

FIG. 14 is a diagram explaining a method of deciding whether or not another CEST component is contained in the CPE spectrum $F_{CPE}(\Delta\omega_a)$. The CPE spectrum $F_{CPE}(\Delta\omega_a)$ and spectrum $F_{CPE\_1}(\Delta\omega_a)$ are shown on the upper side of FIG. 14, and a differential spectrum $D(\Delta\omega_a)$ for the CPE spectrum $F_{CPE}(\Delta\omega_a)$ and spectrum $F_{CPE\_1}(\Delta\omega_a)$ is shown on the lower side of FIG. 14.

First, the CEST deciding unit 100 takes a difference of the spectrum $F_{CPE\_1}(\Delta\omega_a)$ from the CPE spectrum $F_{CPE}(\Delta\omega_a)$ to determine a differential spectrum $D(\Delta\omega_a)$.

Next, the CEST deciding unit 100 decides whether or not another CEST component is contained in the CPE spectrum $F_{CPE}(\Delta\omega_a)$ based on the differential spectrum $D(\Delta\omega_a)$. A method of decision will be described hereinbelow.

EQ. (22) for determining the spectrum $F_{CPE\_1}(\Delta\omega_a)$ includes a CEST term $F_{L,1}(\Delta\omega_a)$ corresponding to the offset frequency $\Delta\omega_{c,1}$. Therefore, the spectrum $F_{CPE\_1}(\Delta\omega_a)$ has a value sufficiently close to the CPE spectrum $F_{CPE}(\Delta\omega_a)$ in the vicinity of the offset frequency $\Delta\omega_{c,1}$. Thus, the signal value of the differential spectrum $D(\Delta\omega_a)$ takes a value near zero in the vicinity of the offset frequency $\Delta\omega_{c,1}$.

However, EQ. (22) for $F_{CPE\_1}(\Delta\omega_a)$ contains no CEST term corresponding to the offset frequency $\Delta\omega_{c,2}$. Therefore, some difference in signal value occurs between the spectrum $F_{CPE\_1}(\Delta\omega_a)$ and CPE spectrum $F_{CPE}(\Delta\omega_a)$ in the vicinity of the offset frequency $\Delta\omega_{c,2}$. Thus, a peak P2 representing the signal component affected by CEST appears in the vicinity of the offset frequency $\Delta\omega_{c,2}$ in the differential spectrum $D(\Delta\omega_a)$.

Therefore, whether or not another CEST component is contained in the CPE spectrum $F_{CPE}(\Delta\omega_a)$ may be decided by deciding whether a peak P2 appears in the differential spectrum $D(\Delta\omega_a)$. In the first embodiment, two thresholds TH1 and TH2 are used to decide whether a peak P2 appears in the differential spectrum $D(\Delta\omega_a)$. The CEST deciding unit 100 compares the two thresholds TH1 and TH2 with the differential spectrum $D(\Delta\omega_a)$, and decides whether or not the differential spectrum $D(\Delta\omega_a)$ traverses the threshold TH1 or threshold TH2. In the case that the differential spectrum $D(\Delta\omega_a)$ traverses the threshold TH1 or threshold TH2, the CEST deciding unit 100 decides that a peak P2 appears in the differential spectrum $D(\Delta\omega_a)$. On the other hand, in the case that the differential spectrum $D(\Delta\omega_a)$ does not traverse the threshold TH1 and TH2, the CEST deciding unit 100 decides that a peak P2 does not appear in the differential spectrum.

Referring to FIG. 14, the differential spectrum $D(\Delta\omega_a)$ includes a peak P2 exceeding the threshold TH1 in the vicinity of the offset frequency $\Delta\omega_{c,2}$. Therefore, the CEST deciding unit 100 decides that another CEST component is contained in the CPE spectrum $F_{CPE}(\Delta\omega_a)$. In the case that another CEST component is decided to be contained in the CPE spectrum $F_{CPE}(\Delta\omega_a)$, the flow goes to Step ST10.

At Step ST10, the detecting unit 93 detects an offset frequency $\Delta\omega_{c,2}$ at which another CEST component appears in the CPE spectrum $F_{CPE}(\Delta\omega_a)$. It is assumed here that the detected value for $\Delta\omega_{c,2}$ is $\Delta\omega_{a2}$. Therefore, the detected value of $\Delta\omega_{c,2}$ is expressed by the equation below:

$$\Delta\omega_{c,2} = \Delta\omega_{a2} \qquad (22d)$$

After detecting the offset frequency $\Delta\omega_{c,2}=\Delta\omega_{a2}$, the flow goes to Step ST11. At Step ST11, the setting unit 94 increments n representing the number of the CEST terms. Therefore, n is changed from n=1 and set to n=2. When n=2 is set, the approximate expression EQ. (16) for the CPE spectrum is given by the equation below:

$$F_{CPE}(\Delta\omega_a) \approx \underbrace{c_0 + c_{MT}F(\Delta\omega_a)}_{\text{Baseline term}} + \underbrace{F_{L,1}(\Delta\omega_a) + F_{L,2}(\Delta\omega_a)}_{\text{CEST term}} \qquad (23)$$

where $$c_0 = \frac{b_1}{b_0^2} \approx \frac{R_2^a \omega_1^2}{R_1^a} \qquad (23a)$$

$$c_{MT} = \frac{1}{b_0} - 1 \qquad (23b)$$

$$F_{L,1}(\Delta\omega_a) = \frac{a_{1,1}}{a_{2,1} + F(\Delta\omega_a - \Delta\omega_{c,1})} \qquad (23c\_1)$$

$$F_{L,2}(\Delta\omega_a) = \frac{a_{1,2}}{a_{2,2} + F(\Delta\omega_a - \Delta\omega_{c,2})} \qquad (23c\_2)$$

After setting n=2, the flow goes back to ST6. At Step ST6, the first fitting unit 95 calculates values of the coefficients $(a_{1,2}, a_{2,2}, \Delta\omega_{c,2})$ for the CEST term $F_{L,2}(\Delta\omega_a)$ in EQ. (23c\_2) by fitting. A method of finding the coefficients $(a_{1,2}, a_{2,2}, \Delta\omega_{c,2})$ will be described hereinbelow.

In the first embodiment, the coefficients $(a_{1,1}, a_{2,1}, \Delta\omega_{c,1})$ for the CEST term $F_{L,1}(\Delta\omega_a)$ have been calculated as $(a_{1,1}(1), a_{2,1}(1), \Delta\omega_{c,1}(1))$, and the coefficients $(c_0, c_{MT})$ for the baseline term have been calculated as $(c_0(1)', (c_{MT}(1)')$ already (see FIG. 12). Therefore, substituting these values into EQS. (23) and (23c\_1), only three coefficients $(a_{1,2}, a_{2,2}, \Delta\omega_{c,2})$ for the CEST term $F_{L,2}(\Delta\omega_a)$ given by EQ. (23c\_2) are unknown. In this case, fitting may be applied to the CPE spectrum $F_{CPE}(\Delta\omega_a)$ so that an error between the CPE spectrum $F_{CPE}(\Delta\omega_a)$ and the approximate expression EQ. (23) comprising the three unknown coefficients $(a_{1,2}, a_{2,2}, \Delta\omega_{c,2})$ is minimized, whereby values of the three coefficients $(a_{1,2}, a_{2,2}, \Delta\omega_{c,2})$ may be determined.

However, the coefficients $(c_0, c_{MT})=(c_0(1)', (c_{MT}(1)')$ for the baseline term have values determined based on the approximate expression EQ. (17) comprising only one CEST term $(F_{L,1}(\Delta\omega_a))$. On the other hand, the approximate expression EQ. (23) has the CEST term $F_{L,1}(\Delta\omega_a)$, and besides, the new CEST term $F_{L,2}(\Delta\omega_a)$ is added thereto. Therefore, if the coefficients $(c_0, c_{MT})$ for the baseline term are fixed to $(c_0(1)', (c_{MT}(1)')$ and then fitting is applied, there is a concern that an estimation error for the coefficients $(a_{1,2}, a_{2,2}, \Delta\omega_{c,2})$ for the CEST term $F_{L,2}(\Delta\omega_a)$ is increased. Accordingly, in the first embodiment, to decrease an estimation error for the coefficients $(a_{1,2}, a_{2,2}, \Delta\omega_{c,2})$ for the CEST term $F_{L,2}(\Delta\omega_a)$, the coefficients $(c_0, c_{MT})$ for the baseline term, in addition to the coefficients $(a_{1,2}, a_{2,2}, \Delta\omega_{c,2})$ for the CEST term $F_{L,2}(\Delta\omega_a)$, are subjected to fitting as unknown coefficients. Therefore, five coefficients are unknown. The first fitting unit 95 applies fitting to the CPE spectrum $F_{CPE}(\Delta\omega_a)$ using the approximate expression EQ. (23) comprising the five unknown coefficients. In applying fitting, the first fitting unit 95 first sets initial values for the coefficients $(a_{1,2}, a_{2,2}, \Delta\omega_{c,2})$ for the CEST term $F_{L,2}(\Delta\omega_a)$ and those for the coefficients $(c_0, c_{MT})$ for the baseline term. The initial value for the coefficient $\Delta\omega_{c,2}$ is set to the value of the offset frequency $\Delta\omega_{c,2}$ detected at Step ST10, that is, $\Delta\omega_{c,2}=\Delta\omega_{a2}$ (see EQ. (22d)). The initial values for the coefficients $a_{1,2}$ and $a_{2,2}$ may be calculated based on a feature quantity of the peak P2 (see FIG. 14) in the differential spectrum $D(\Delta\omega_a)$ (such as the peak height, peak width at half height, or the like). On the other hand, the initial values for the coefficients ($c_0$, $c_{MT}$) for the baseline term may be set to the values ($c_0$, $c_{MT}$)=($c_0(1)'$, ($c_{MT}(1)'$) (see FIG. 12) determined when n=1. After setting the initial values, the first fitting unit 95 changes the values of the coefficients on the basis of the initial values, and calculates values of the coefficients ($a_{1,2}$, $a_{2,2}$, $\Delta\omega_{c,2}$) and coefficients ($c_0$, $c_{MT}$) with an error between the CPE spectrum $F_{CPE}(\Delta\omega_a)$ and EQ. (23) minimized. FIG. 15 shows the values of the coefficients calculated by fitting. In FIG. 15, ($c_0$, $c_{MT}$)=($c_0(2)$, $c_{MT}(2)$), and ($a_{1,2}$, $a_{2,2}$, $\Delta\omega_{c,2}$)=($a_{1,2}(2)$, $a_{2,2}(2)$, $\Delta\omega_{c,2}(2)$) are shown.

In addition to the coefficients ($a_{1,2}$, $a_{2,2}$, $\Delta\omega_{c,2}$) for the CEST term $F_{L,2}(\Delta\omega_a)$, the coefficients ($c_0$, $c_{MT}$) for the baseline term are calculated by fitting. However, as described earlier, the values of the coefficients ($c_0$, $c_{MT}$) for the baseline term calculated at Step ST6 may possibly have a large estimation error. Accordingly, the flow goes to Step ST7 to recalculate the coefficients ($c_0$, $c_{MT}$) for the baseline term.

At Step ST7, two steps ST71 and ST72 are sequentially performed. At Step ST71, the CRZ-spectrum generating unit 96 uses EQ. (18) to generate a CRZ-spectrum $Z_{CRZ}$ obtained by removing CEST components from the Z-spectrum. However, since n=2 is set, EQ. (18) is represented by the equation below:

$$\frac{1}{Z_{CRZ}} = \frac{1}{Z} - \frac{F_{L,1}(\Delta\omega_a) + F_{L,2}(\Delta\omega_a)}{F(\Delta\omega_a) + \delta(\Delta\omega_a)} \quad (24)$$

The CRZ-spectrum generating unit 96 uses EQ. (24) to generate a CRZ-spectrum $Z_{CRZ}$ obtained by removing CEST components from the Z-spectrum. After generating the CRZ-spectrum $Z_{CRZ}$, the flow goes to Step ST72.

At Step ST72, the second fitting unit 97 applies fitting so that an error between the CRZ-spectrum $Z_{CRZ}$ generated using EQ. (24), and EQ. (20) is minimized, and calculates values of the coefficients ($b_0$, $b_1$, $b_2$, $\Delta\omega_0$) in EQ. (20) with the error minimized. In applying fitting, the second fitting unit 97 first sets initial values for the coefficients ($b_1$, $b_1$, $b_2$, $\Delta\omega_0$). The second fitting unit 97 here sets the coefficients ($b_0$, $b_1$, $b_2$, $\Delta\omega_0$)=($b_0(1)$, $b_1(1)$, $b_2(1)$, $\Delta\omega_0(1)$) (see FIG. 12) calculated when n=1 as the initial values for the coefficients ($b_0$, $b_1$, $b_2$, $\Delta\omega_0$) at n=2. After setting the initial values for the coefficients ($b_0$, $b_1$, $b_2$, $\Delta\omega_0$) at n=2, the second fitting unit 97 changes the values of the coefficients ($b_0$, $b_1$, $b_2$, $\Delta\omega_0$) on the basis of the initial values, and calculates values of the coefficients ($b_0$, $b_1$, $b_2$, $\Delta\omega_0$) with the error between the CRZ-spectrum $Z_{CRZ}$ generated using EQ. (24), and EQ. (20) minimized. FIG. 16 shows the values of the coefficients ($b_0$, $b_1$, $b_2$, $\Delta\omega_0$) calculated by fitting at n=2. In FIG. 16, the calculated values of the coefficients ($b_0$, $b_1$, $b_2$, $\Delta\omega_0$) are shown as ($b_0$, $b_1$, $b_2$, $\Delta\omega_0$)=($b_0(2)$, $b_1(2)$, $b_2(2)$, $\Delta\omega_0(2)$).

After determining these values of the coefficients, the coefficient-value calculating unit 98 substitutes ($b_0$, $b_1$)=($b_0(2)$, $b_1(2)$) into EQ. (23a) to calculate $c_0$. It also substitutes $b_0=b_0(2)$ into EQ. (23b) to calculate $c_{MT}$. Thus, the values of the coefficients ($c_0$, $c_{MT}$) for the baseline term in EQ. (23) may be calculated. FIG. 17 shows the calculated values of the coefficients ($c_0$, $c_{MT}$). In FIG. 17, they are shown as ($c_0$, $c_{MT}$)=($c_0(2)'$, $c_{MT}(2)'$). After determining these values, the flow goes to Step ST8.

At Step ST8, the spectrum calculating unit 99 calculates a spectrum $F_{CPE\_n}(\Delta\omega_a)$ using EQ. (21). However, since n=2 is set, EQ. (21) is given by the equation below:

$$F_{CPE\_2}(\Delta\omega_a) = \underbrace{c_0 + c_{MT}F(\Delta\omega_a)}_{\text{Baseline term}} + \underbrace{F_{L,1}(\Delta\omega_a) + F_{L,2}(\Delta\omega_a)}_{\text{CEST term}} \quad (25)$$

where $$F_{L,1}(\Delta\omega_a) = \frac{a_{1,1}}{a_{2,1} + F(\Delta\omega_a - \Delta\omega_{c,1})} \quad (25c\_1)$$

$$F_{L,2}(\Delta\omega_a) = \frac{a_{1,2}}{a_{2,2} + F(\Delta\omega_a - \Delta\omega_{c,2})} \quad (25c\_2)$$

Figure 18:
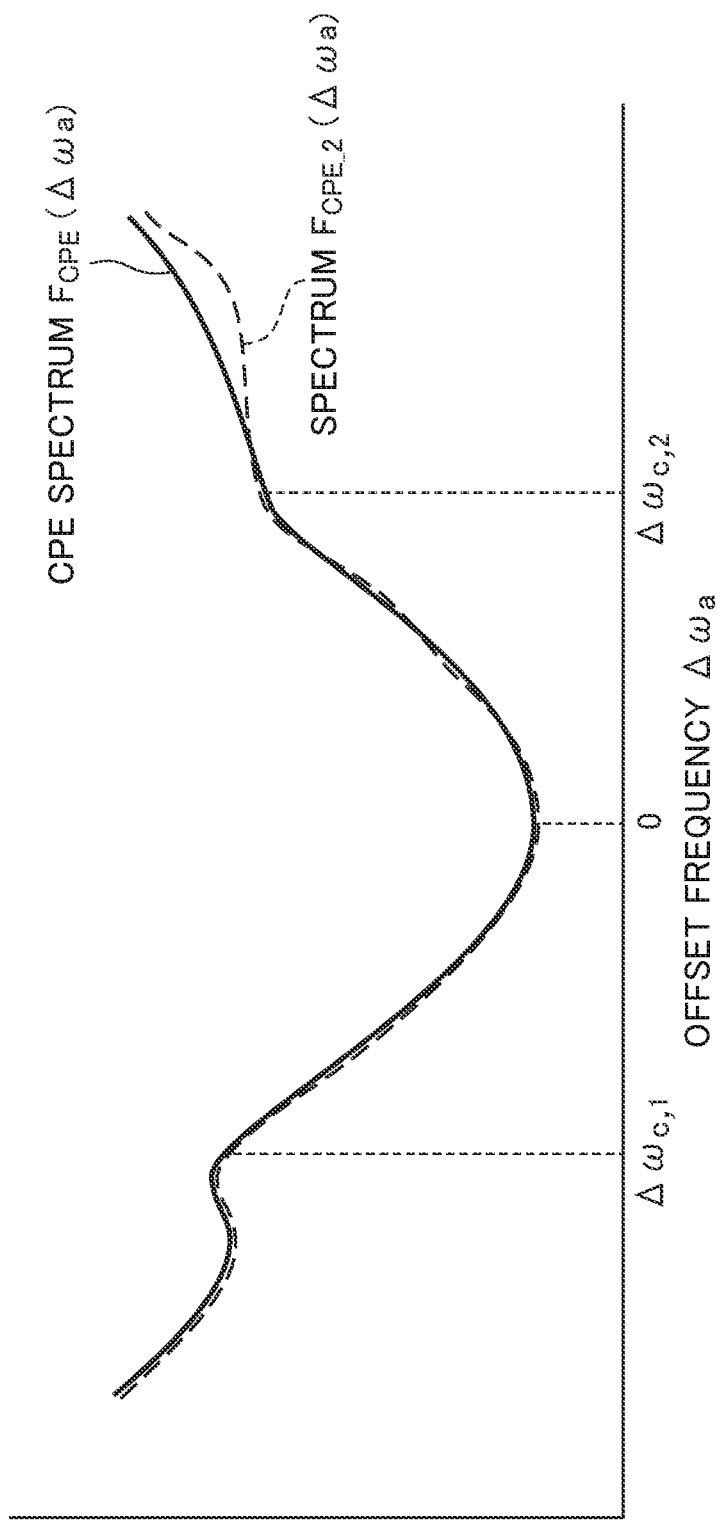
FIG. 18 is a diagram schematically showing a spectrum $F_{CPE\_2}(\Delta\omega_a)$.

As shown in FIG. 17, the coefficients ($c_0$, $c_{MT}$) are calculated as ($c_0$, $c_{MT}$)=($c_0(2)'$, ($c_{MT}(2)'$), and the coefficients ($a_{1,2}$, $a_{2,2}$, $\Delta\omega_{c,2}$) are calculated as ($a_{1,2}$, $a_{2,2}$, $\Delta\omega_{c,2}$)=($a_{1,2}(2)$, $a_{2,2}(2)$, $\Delta\omega_{c,2}(2)$). Moreover, as shown in FIG. 12, the coefficients ($a_{1,1}$, $a_{2,1}$, $\Delta\omega_{c,1}$) have been calculated as ($a_{1,1}$, $a_{2,1}$, $\Delta\omega_{c,1}$)=($a_{1,1}(1)$, $a_{2,1}(1)$, $\Delta\omega_{c,1}(1)$). Therefore, by substituting these values of the coefficients into EQS. (25), (25c\_1), and (25c\_2), the spectrum $F_{CPE\_2}(\Delta\omega_a)$ may be calculated. FIG. 18 schematically shows the spectrum $F_{CPE\_2}(\Delta\omega_a)$. FIG. 18 shows the CPE spectrum $F_{CPE}(\Delta\omega_a)$, in addition to the spectrum $F_{CPE\_2}(\Delta\omega_a)$, for comparison. It can be seen that the spectrum $F_{CPE\_2}(\Delta\omega_a)$ has a waveform sufficiently close to the CPE spectrum $F_{CPE}(\Delta\omega_a)$ in the vicinity of the offset frequencies $\Delta\omega_{c,1}$ and $\Delta\omega_{c,2}$. After calculating the spectrum $F_{CPE\_2}(\Delta\omega_a)$, the flow goes to Step ST9.

At Step ST9, the CEST deciding unit 100 decides whether or not another CEST component different from the CEST components represented by the CEST terms $F_{L,1}(\Delta\omega_a)$ and $F_{L,2}(\Delta\omega_a)$ (see EQS. (23c\_1) and (23c\_2)) is contained in the CPE spectrum $F_{CPE}(\Delta\omega_a)$.

Figure 19:
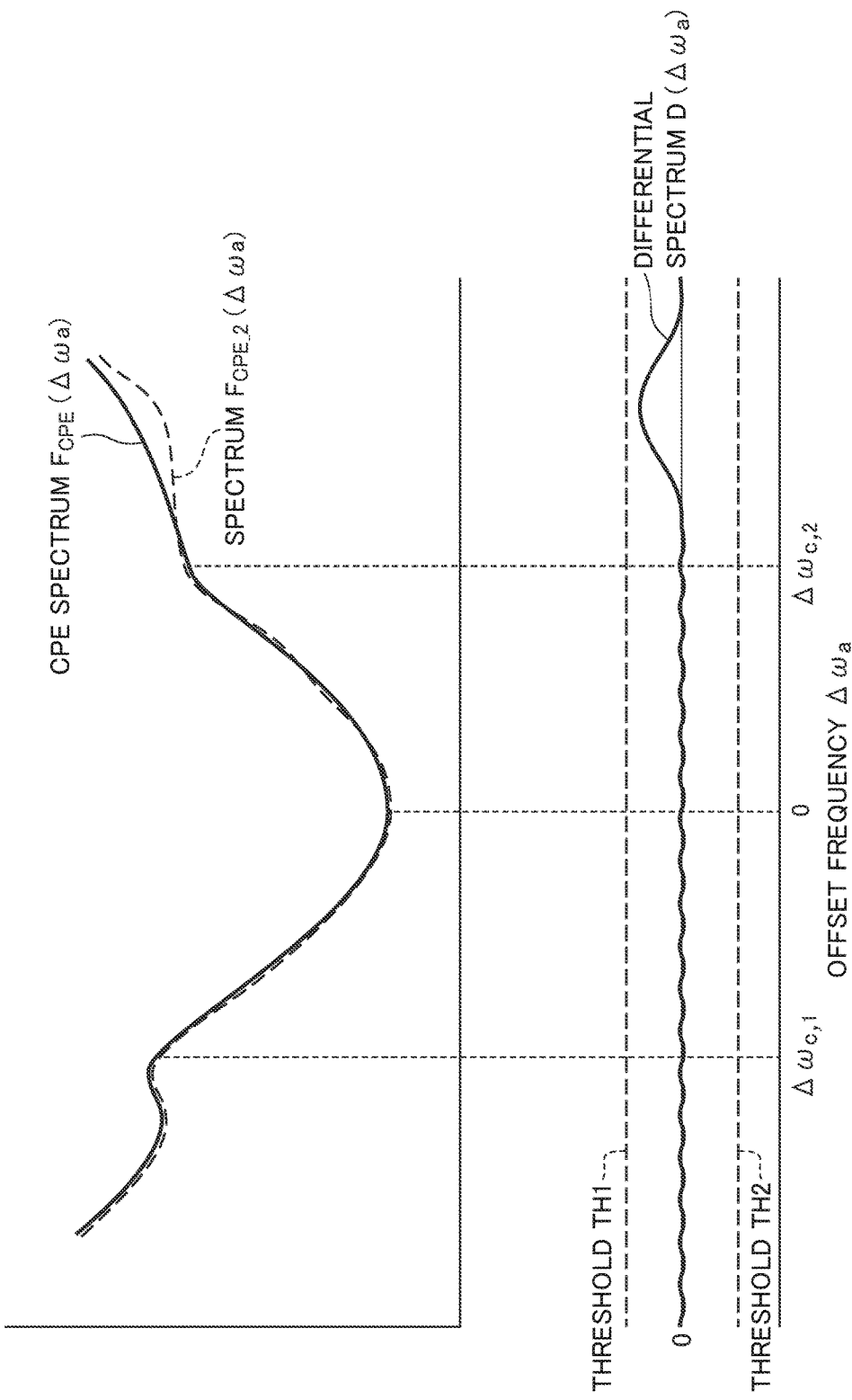
FIG. 19 is a diagram explaining a method of deciding whether or not another CEST component is contained in the CPE spectrum $F_{CPE}(\Delta\omega_a)$.

FIG. 19 is a diagram explaining a method of deciding whether or not another CEST component is contained in the CPE spectrum $F_{CPE}(\Delta\omega_a)$. The CEST deciding unit 100 takes a difference of the spectrum $F_{CPE\_2}(\Delta\omega_a)$ from the CPE spectrum $F_{CPE}(\Delta\omega_a)$ to determine a differential spectrum $D(\Delta\omega_a)$, and compares the differential spectrum $D(\Delta\omega_a)$ with the thresholds TH1 and TH2.

Since the differential spectrum $D(\Delta\omega_a)$ does not exceed the thresholds TH1 and TH2, the spectrum $F_{CPE\_2}(\Delta\omega_a)$ may be considered to have a waveform sufficiently close to the CPE spectrum $F_{CPE}(\Delta\omega_a)$. In this case, it may be considered that the CEST components contained in the CPE spectrum $F_{CPE}(\Delta\omega_a)$ is successfully expressed by the two CEST terms $F_{L,1}(\Delta\omega_a)$ and $F_{L,2}(\Delta\omega_a)$ contained in EQ. (25) of the spectrum $F_{CPE\_2}(\Delta\omega_a)$. Therefore, in the case that the differential spectrum $D(\Delta\omega_a)$ does not exceed the thresholds TH1 and TH2, the CEST deciding unit 100 decides that no other CEST component is contained in the CPE spectrum $F_{CPE}(\Delta\omega_a)$. In the case that no other CEST component is decided to be present, the flow goes to Step ST12.

FIG. 19 shows a case in which the differential spectrum $D(\Delta\omega_a)$ does not exceed the thresholds TH1 and TH2. However, there may be a case in which the differential spectrum $D(\Delta\omega_a)$ exceeds the threshold TH1 or TH2. The case in which the differential spectrum $D(\Delta\omega_a)$ exceeds the threshold TH1 or TH2 will be described hereinbelow.

Figure 20:
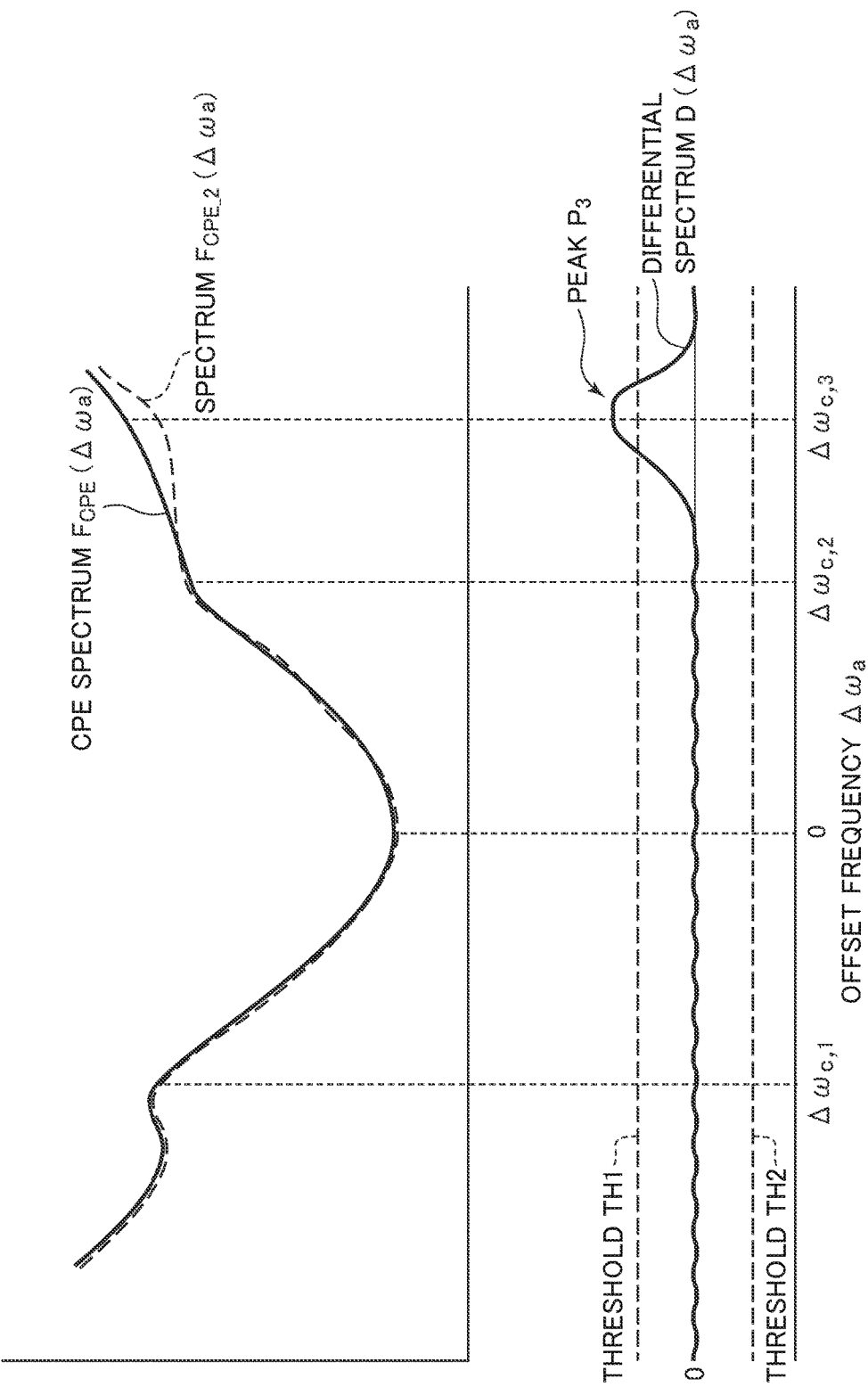
FIG. 20 is a diagram showing a case in which a differential spectrum $D(\Delta\omega_a)$ exceeds a threshold TH1.

FIG. 20 is a diagram showing a case in which the differential spectrum $D(\Delta\omega_a)$ exceeds the threshold TH1. In FIG. 20, a peak P3 exceeding the threshold TH1 appears in the differential spectrum $D(\Delta\omega_a)$ in the vicinity of the offset frequency $\Delta\omega_{c,3}$. Therefore, the CEST deciding unit 100 decides that another CEST component is contained in the CPE spectrum $F_{CPE}(\Delta\omega_a)$. In the case that another CEST component is decided to be contained in the CPE spectrum $F_{CPE}(\Delta\omega_a)$, the flow goes to Step ST10, where an offset frequency $\Delta\omega_{c,3}$ at which the other CEST component appears is detected. After detecting the offset frequency $\Delta\omega_{c,3}$, the flow goes to Step ST11, where n is incremented, and a new CEST term $F_{L,3}(\Delta\omega_a)$ is added to the approximate expression EQ. (23) of the CPE spectrum $F_{CPE}(\Delta\omega_a)$. Then, Steps ST6 to ST9 are performed. Therefore, each time it is decided that another CEST component is contained in the CPE spectrum $F_{CPE}(\Delta\omega_a)$ at Step ST9, a new CEST term is added to the approximate expression of the CPE spectrum $F_{CPE}(\Delta\omega_a)$, and Steps ST6 to ST9 are performed. Consider a case in which it is decided at Step ST9 that an i-th CEST component is contained in the CPE spectrum $F_{CPE}(\Delta\omega_a)$, for example. In this case, since n=i is set at Step ST11, an approximate expression for the CPE spectrum $F_{CPE}(\Delta\omega_a)$ is given by the equation below.

$$F_{CPE}(\Delta\omega_a) \approx \underbrace{c_0 + c_{MT} F(\Delta\omega_a)}_{\text{Baseline term}} + \underbrace{F_{L,1}(\Delta\omega_a) + F_{L,2}(\Delta\omega_a) + F_{L,3}(\Delta\omega_a) + \ldots + F_{L,i-1}(\Delta\omega_a) + F_{L,i}(\Delta\omega_a)}_{\text{CEST terms}} \qquad (26)$$

where $$c_0 = \frac{b_1}{b_0^2} \approx \frac{R_2^a \omega_1^2}{R_1^a} \qquad (26a)$$

$$c_{MT} = \frac{1}{b_0} - 1 \qquad (26b)$$

$$F_{L,1}(\Delta\omega_a) = \frac{a_{1,1}}{a_{2,1} + F(\Delta\omega_a - \Delta\omega_{c,1})} \qquad (26c\_1)$$

$$F_{L,2}(\Delta\omega_a) = \frac{a_{1,2}}{a_{2,2} + F(\Delta\omega_a - \Delta\omega_{c,2})} \qquad (26c\_2)$$

$$F_{L,3}(\Delta\omega_a) = \frac{a_{1,3}}{a_{2,3} + F(\Delta\omega_a - \Delta\omega_{c,3})} \qquad (26c\_3)$$

$$\vdots$$

$$F_{L,i-1}(\Delta\omega_a) = \frac{a_{1,i-1}}{a_{2,i-1} + F(\Delta\omega_a - \Delta\omega_{c,i-1})} \qquad (26c\_i-1)$$

$$F_{L,i}(\Delta\omega_a) = \frac{a_{1,i}}{a_{2,i} + F(\Delta\omega_a - \Delta\omega_{c,i})} \qquad (26c\_i)$$

In the approximate expression EQ. (26) above, $F_{1,i}(\Delta\omega_a)$ represents a newly added CEST term. When the CPE spectrum is represented by the approximate expression EQ. (26), coefficients for the CEST terms in EQS. (26c_1) to (26c_i-1) have been already calculated. Therefore, five coefficients ($c_0$, $c_{MT}$) and ($a_{1,i}$, $a_{2,i}$, $\Delta\omega_{c,i}$) are unknown. Once n=i has been set at Step ST11, the flow goes back to ST6. At Step ST6, the first fitting unit 95 calculates values of the five coefficients ($c_0$, $c_{MT}$) and ($a_{i,1}$, $a_{2,i}$, $\Delta\omega_{c,i}$) using the approximate expression EQ. (26). FIG. 21 shows the values of the coefficients calculated at n=i.

After calculating values of the coefficients for the CEST terms, the flow goes to Step ST71. At Step ST71, the CRZ-spectrum generating unit 96 uses EQ. (18) to generate a CRZ-spectrum $Z_{CRZ}$ obtained by removing CEST components from the Z-spectrum. Since n=i, EQ. (18) is given by the equation below:

$$\frac{1}{ZCR} = \frac{1}{Z} - \frac{\begin{array}{l} F_{L,i}(\Delta\omega_a) + F_{L,2}(\Delta\omega_a) + \\ F_{L,3}(\Delta\omega_a) + \ldots + F_{L,i-1}(\Delta\omega_a) + F_{L,i}(\Delta\omega_a) \end{array}}{F(\Delta\omega_a) + \delta(\Delta\omega_a)} \qquad (27)$$

After determining the CRZ-spectrum $Z_{CRZ}$, the flow goes to Step ST72. At Step ST72, the second fitting unit 97 applies fitting so that an error between the CRZ-spectrum $Z_{CRZ}$ generated according to EQ. (27), and EQ. (20) is minimized, and calculates values of the coefficients ($b_0$, $b_1$, $b_2$, $\Delta\omega_0$) in EQ. (20) with the error minimized. In applying fitting, the second fitting unit 97 first sets initial values for the coefficients ($b_0$, $b_1$, $b_2$, $\Delta\omega_0$). The second fitting unit 97 here sets the values of the coefficients ($b_0$, $b_1$, $b_2$, $\Delta\omega_0$) calculated when n=i-1 (not shown) as the initial values for the coefficients ($b_0$, $b_1$, $b_2$, $\Delta\omega_0$) at n=i. After setting the initial values for the coefficients ($b_0$, $b_1$, $b_2$, $\Delta\omega_0$) at n=i, the second fitting unit 97 changes the values of the coefficients ($b_0$, $b_1$, $b_2$, $\Delta\omega_0$) on the basis of the initial values, and calculates values of the coefficients ($b_0$, $b_1$, $b_2$, $\Delta\omega_0$) with the error between the CRZ-spectrum $Z_{CRZ}$ generated using EQ. (27), and EQ. (20) minimized. FIG. 22 shows the values of the coefficients ($b_0$, $b_1$, $b_2$, $\Delta\omega_0$) calculated by fitting at n=i. In FIG. 22, they are shown as ($b_0$, $b_1$, $b_2$, $\Delta\omega_0$)=($b_0(i)$, $b_1(i)$, $b_2(i)$, $\Delta\omega^0(i)$).

After determining these values of the coefficients, the coefficient-value calculating unit 98 substitutes ($b_0$, $b_1$)=($b_0(i)$, $b_1(i)$) into EQ. (26a) to calculate $c_0$. It also substitutes $b_0=b_0(i)$ into EQ. (26b) to calculate $c_{MT}$. Thus, the values of the coefficients ($c_0$, $c_{MT}$) for the baseline term in EQ. (26) may be calculated. FIG. 23 shows the calculated values of the coefficients ($c_0$, $c_{MT}$). In FIG. 23, they are shown as ($c_0$, $c_{MT}$)=($c_0(i)'$, $c_{MT}(i)'$). After calculating these values, the flow goes to Step ST8.

At Step ST8, the spectrum calculating unit 99 calculates a spectrum $F_{CPE\_n}(\Delta\omega_a)$ using EQ. (21). However, since n=i, EQ. (21) is given by the equation below:

$$F_{CPE\_i}(\Delta\omega_a) \approx \underbrace{c_0 + c_{MT}F(\Delta\omega_a)}_{\text{Baseline term}} + \qquad (28)$$

$$\underbrace{F_{L,1}(\Delta\omega_a) + F_{L,2}(\Delta\omega_a) + F_{L,3}(\Delta\omega_a) + \ldots + F_{L,i-1}(\Delta\omega_a) + F_{L,i}(\Delta\omega_a)}_{\text{CEST terms}}$$

where $$F_{L,1}(\Delta\omega_a) = \frac{a_{1,1}}{a_{2,1} + F(\Delta\omega_a - \Delta\omega_{c,1})} \qquad (28c\_1)$$

$$F_{L,2}(\Delta\omega_a) = \frac{a_{1,2}}{a_{2,2} + F(\Delta\omega_a - \Delta\omega_{c,2})} \qquad (28c\_2)$$

$$F_{L,3}(\Delta\omega_a) = \frac{a_{1,3}}{a_{2,3} + F(\Delta\omega_a - \Delta\omega_{c,3})} \qquad (28c\_3)$$

$$\vdots$$

$$F_{L,i-1}(\Delta\omega_a) = \frac{a_{1,i-1}}{a_{2,i-1} + F(\Delta\omega_a - \Delta\omega_{c,i-1})} \qquad (28c\_i-1)$$

$$F_{L,i}(\Delta\omega_a) = \frac{a_{1,i}}{a_{2,i} + F(\Delta\omega_a - \Delta\omega_{c,i})} \qquad (28c\_i)$$

Figure 24:
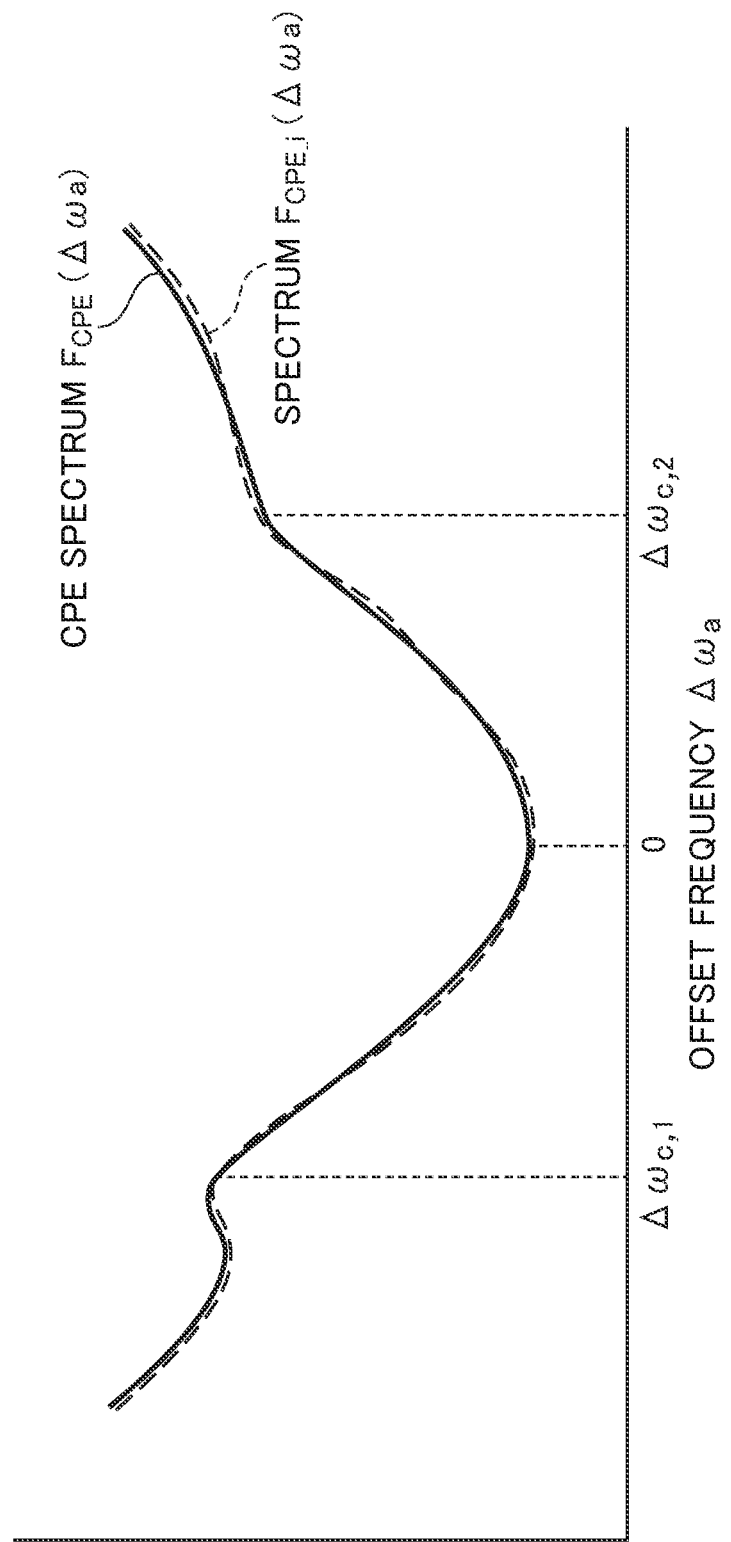
FIG. 24 is a diagram schematically showing a spectrum $F_{CPE\_i}(\Delta\omega_a)$.

Since the coefficients in EQ. (28) have been already determined, a spectrum $F_{CPE\_i}(\Delta\omega_a)$ may be calculated by substituting these values of the coefficients. FIG. 24 schematically shows the spectrum $F_{CPE\_i}(\Delta\omega_a)$. FIG. 24 shows the CPE spectrum $F_{CPE}(\Delta\omega_a)$, in addition to the spectrum $F_{CPE\_i}(\Delta\omega_a)$, for comparison. After calculating the spectrum $F_{CPE\_i}(\Delta\omega_a)$, the flow goes to Step ST9.

At Step ST9, the CEST deciding unit 100 decides whether or not another CEST component is contained in the CPE spectrum $F_{CPE}(\Delta\omega_a)$. Thus, a loop consisting of Steps ST10, ST11, ST6, ST7, ST8, and ST9 is repetitively performed until it is decided that no other CEST component is contained in the CPE spectrum $F_{CPE}(\Delta\omega_a)$ at Step ST9. Once it has been decided that no other CEST component is contained in the CPE spectrum $F_{CPE}(\Delta\omega_a)$ at Step ST9, the flow goes to Step ST12.

At Step ST12, the spectrum estimating unit 101 (see FIG. 2) estimates a Z-spectrum (referred to as "ideal Z-spectrum" hereinbelow) Zideal expressed by the sum of the baseline term and CEST terms. The ideal Z-spectrum Zideal may be given using EQS. (11) and (16) by the equation below:

$$\left(\frac{1}{Z_{ideal}} - 1\right)F(\Delta\omega_a) = c_0 + c_{MT}F(\Delta\omega_a) + \sum_n F_{Ln}(\Delta\omega_a) \qquad (29)$$

The spectrum estimating unit 101 uses EQ. (29) to estimate the ideal Z-spectrum Zideal. After determining the ideal Z-spectrum Zideal, the flow goes to Step ST13.

At Step ST13, the spectrum comparing unit 102 (see FIG. 2) compares the ideal Z-spectrum Zideal with the Z-spectrum generated at Step ST2, and decides whether or not the Z-spectrum is reproduced by the ideal Z-spectrum Zideal. This decision may be made as follows.

First, the spectrum comparing unit 102 compares the ideal Z-spectrum Zideal with the Z-spectrum generated at Step ST2, and determines a difference between the signal value of the ideal Z-spectrum Zideal and that of the Z-spectrum for each offset frequency. Next, the spectrum comparing unit 102 decides whether or not the square sum of the differences is sufficiently small. The decision as to whether the square sum of the differences is large or not may be made by, for example, determining beforehand a threshold for deciding whether the square sum of the differences is large or small, and comparing the square sum of the differences with the threshold. The spectrum comparing unit 102 can decide that the square sum of the differences is small in the case that it is equal to or smaller than the threshold, and that the square sum of the differences is large in the case that it is larger than the threshold.

When the square sum of the differences is small, the spectrum comparing unit 102 decides that the Z-spectrum is reproduced by the ideal Z-spectrum Zideal. In this case, the flow goes from Step ST13 to Step ST14.

On the other hand, when the square sum of the differences is large, the spectrum comparing unit 102 decides that the Z-spectrum is not reproduced by the ideal Z-spectrum Zideal. In this case, the flow goes back to Step ST7, where the baseline term is recalculated. Therefore, coefficients for the baseline term are recalculated until it is decided that the Z-spectrum is reproduced by the ideal Z-spectrum Zideal at Step ST13. Once it has been decided at Step ST13 that the Z-spectrum is reproduced by the ideal Z-spectrum Zideal, the flow goes to Step ST14.

At Step ST14, the counting unit 103 (see FIG. 2) counts the total number TN of the CEST components contained in the CPE spectrum $F_{CPE}(\Delta\omega_a)$. In the first embodiment, n is incremented each time another CEST component is decided to be contained in the CPE spectrum $F_{CPE}(\Delta\omega_a)$ (see Step ST11), so that the value of n represents the total number TN of the CEST components contained in the CPE spectrum $F_{CPE}(\Delta\omega_a)$. That is, the total number TN of the CEST components is TN=n. Thus, the total number TN of the CEST components contained in the CPE spectrum $F_{CPE}(\Delta\omega_a)$ may be counted. It is assumed here that n=2 for convenience of explanation. Therefore, the total number TN of the CEST components contained in the CPE spectrum $F_{CPE}(\Delta\omega_a)$ is counted as TN=2. After the count has been determined as TN=2, the flow goes to Step ST15.

At Step ST15, the coefficients ($c_0$, $c_{MT}$) for the baseline term used in the approximate expression EQ. (16) for the CPE spectrum $F_{CPE}(\Delta\omega_a)$ are fixed to the finally obtained values of the coefficients for the baseline term, and then the coefficients for the CEST terms are recalculated. Since it is assumed here that n=2, the finally obtained values of the coefficients for the baseline term are the values ($c_0(2)'$, ($c_{MT}(2)'$) determined using the approximate expression EQ. (23) (see FIG. 17). Therefore, the values of the coefficients for the baseline term are fixed to $(c_0, c_{MT})=(c_0(2)', (c_{MT}(2)'),$ and coefficients for the CEST terms are recalculated. Now Step ST15 will be described hereinbelow.

Figure 25:
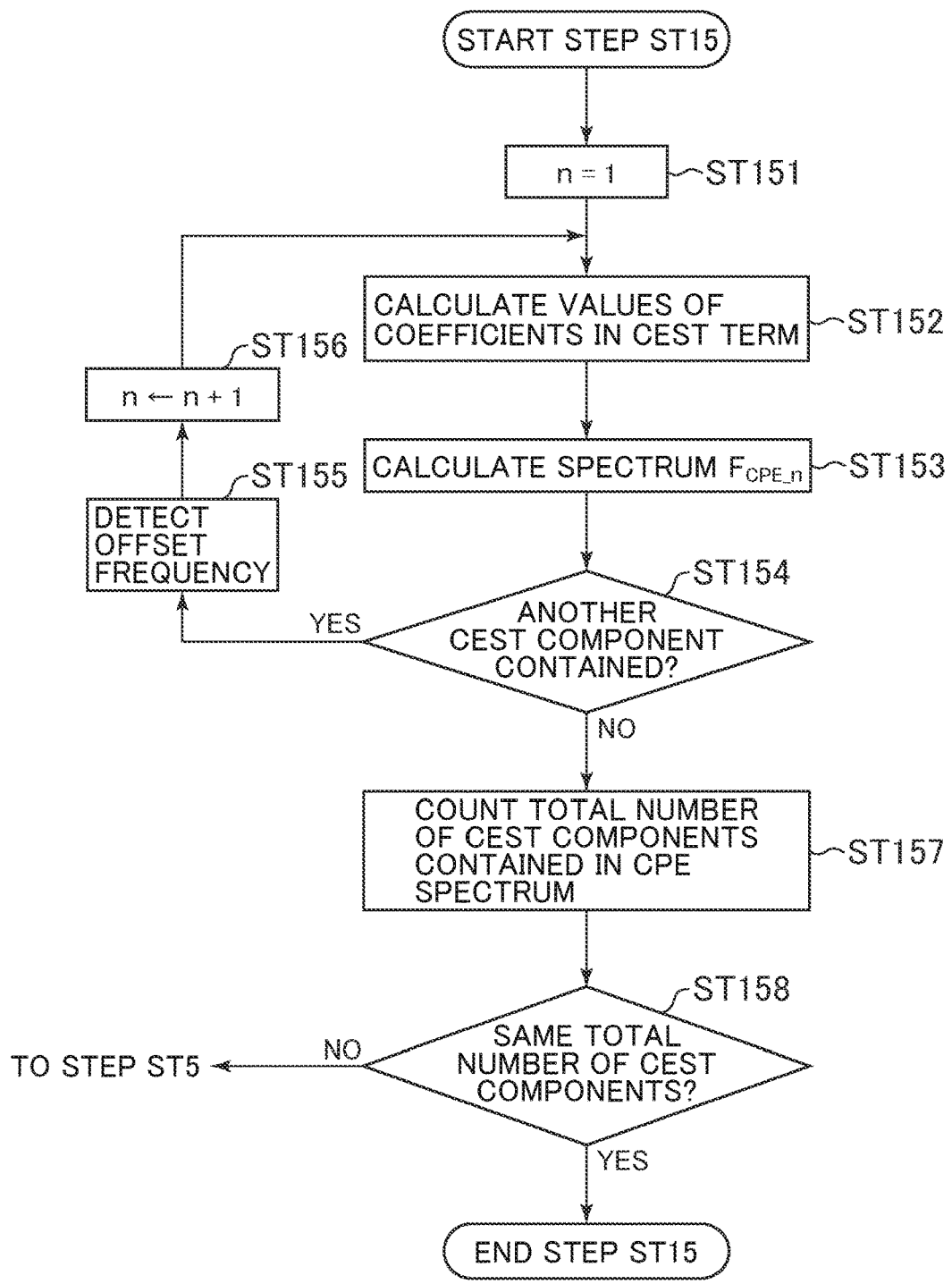
FIG. 25 is a chart showing the flow at Step ST15.

FIG. 25 is a chart showing the flow at Step ST15. At Step ST151, the setting unit 94 sets n representing the number of the CEST terms to an initial value (n=1). After setting n=1, the flow goes to Step ST152.

At Step ST152, the first fitting unit 95 calculates values of the three coefficients $(a_{1,1}, a_{2,1}, \Delta\omega_{c,1})$ included in the CEST term $F_{L,1}(\Delta\omega_a)$ in the approximate expression EQ. (17) for the CPE spectrum. When calculating values of the coefficients, the first fitting unit 95 first fixes the coefficients $(c_0, c_{MT})$ for the baseline term in EQ. (17) to $(c_0, c_{MT})=(c_0(2)', (c_{MT}(2)')$. Therefore, in the approximate expression EQ. (17), only three coefficients $(a_{1,1}, a_{2,1}, \Delta\omega_{c,1})$ for the CEST term $F_{L,1}(\Delta\omega_a)$ are unknown. The first fitting unit 95 applies fitting so that an error between the CPE spectrum $F_{CPE}(\Delta\omega_a)$ and approximate expression EQ. (17) including the three unknown coefficients is minimized. When performing fitting, the first fitting unit 95 first sets initial values for the coefficients $(a_{1,1}, a_{2,1}, \Delta\omega_{c,1})$ for the CEST term $F_{L,1}(\Delta\omega_a)$. For the initial values for the coefficients $(a_{1,1}, a_{2,1}, \Delta\omega_{c,1})$ for the CEST term $F_{L,1}(\Delta\omega_a)$, the values of the coefficients for the CEST term calculated at Step ST6 may be employed. After setting the initial values, the first fitting unit changes the values of the coefficients on the basis of the initial values, and calculates values of the three coefficients $(a_{1,1}, a_{2,1}, \Delta\omega_{c,1})$ for the CEST term $F_{L,1}(\Delta\omega_a)$ with the error between the CPE spectrum $F_{CPE}(\Delta\omega_a)$ and EQ. (17) minimized. After calculating these values of the coefficients, the flow goes to Step ST153.

At Step ST153, the spectrum calculating unit 99 uses EQS. (22) and (22c) to calculate the spectrum $F_{CPE\_1}(\Delta\omega_a)$.

The values of the coefficients $(c_0, c_{MT})$ for the baseline term in EQ. (22) are fixed to $(c_0, c_{MT})=(c_0(2)', (c_{MT}(2)')$ (FIG. 17). Moreover, the coefficients $(a_{1,1}, a_{2,1}, \Delta\omega_{c,1})$ for the CEST term in EQ. (22c) have been calculated at Step ST152. Therefore, by substituting these values of the coefficients into EQ. (22) and (22c), the spectrum $F_{CPE\_1}(\Delta\omega_a)$ may be calculated. After calculating the spectrum $F_{CPE\_1}(\Delta\omega_a)$, the flow goes to Step ST154.

At Step ST154, the CEST deciding unit 100 decides whether or not another CEST component different from the CEST component represented by the CEST term $F_{L,1}(\Delta\omega_a)$ (see EQ. (17c)) is contained in the CPE spectrum $F_{CPE}(\Delta\omega_a)$. In the case that no other CEST component is decided to be contained, the flow goes to Step ST157. On the other hand, in the case that another CEST component is decided to be contained, the flow goes to Step ST155.

At Step ST155, the detecting unit 93 detects an offset frequency at which the other CEST component appears in the CPE spectrum $F_{CPE}(\Delta\omega_a)$. After detecting the offset frequency, the flow goes to Step ST156.

At Step ST156, the setting unit 94 increments n from n=1 to n=2. When n=2 is set, the approximate expression for the CPE spectrum $F_{CPE}(\Delta\omega_a)$ is given by EQ. (23). After incrementing n, the flow goes back to Step ST152.

Therefore, each time another CEST component is decided to be contained in the CPE spectrum $F_{CPE}(\Delta\omega_a)$ at Step ST154, a CEST term is added to the approximate expression of the CPE spectrum $F_{CPE}(\Delta\omega_a)$, and values of coefficients included in the added CEST term are calculated. Thus, values of the coefficients for the CEST term may be calculated for the case where the coefficients $(c_0, c_{MT})$ for the baseline term are fixed to $(c_0, c_{MT})=(c_0(2)', (c_{MT}(2)')$. Then, when it is decided at Step ST154 that no other CEST component is contained in the CPE spectrum $F_{CPE}(\Delta\omega_a)$, the flow goes to Step ST157.

At Step ST157, the counting unit 103 counts the total number TN of the CEST components contained in the CPE spectrum $F_{CPE}(\Delta\omega_a)$. After counting the total number TN of the CEST components, the flow goes to Step ST158.

At Step ST158, the counting unit 103 decides whether or not the total number TN of the CEST components counted at Step ST157 is equal to the total number TN(=2) of the CEST components counted at Step ST14. In the case that the total number TN of the CEST components is decided to be different, an estimation error of the coefficients for the CEST term or those for the baseline is considered to be large. Accordingly, in the case that the total number TN of the CEST components is decided to be different, the flow goes back to Step ST5 (see FIG. 7). Then, Steps ST5 to ST15 are repetitively performed until it is decided that the total number of the CEST components is equal at Step ST158. Once it has been decided that the total number TN of the CEST components is equal at Step ST158, the flow exits Step ST15 and goes to Step ST16.

At Step ST16, the image producing unit 90 produces a CEST image based on the values of the coefficients for the CEST terms obtained by the processing at Steps ST1 to ST15. The flow is thus terminated.

In the first embodiment, a Z-spectrum is transformed into a CPE spectrum $F_{CPE}(\Delta\omega_a)$. Since the baseline component (signal component unaffected by CEST) in the CPE spectrum $F_{CPE}(\Delta\omega_a)$ may be approximated by an even function, it has no large peak caused by a Lorentzian function. Therefore, transformation of the Z-spectrum into the CPE spectrum $F_{CPE}(\Delta\omega_a)$ makes it easy to isolate the CEST component, so that an estimation error in the values of the coefficients included in the CEST terms may be decreased.

Moreover, in the first embodiment, a difference between the ideal Z-spectrum Zideal and Z-spectrum is determined at Step ST13, and in the case that the square sum of the differences exceeds a threshold, the flow goes back to Step ST7 to recalculate the coefficients for the baseline term. Therefore, an estimation error in the coefficients for the baseline term may be further decreased.

Furthermore, in the first embodiment, the values of the coefficients for the baseline term are fixed to recalculate coefficients for the CEST term at Step ST15. Therefore, an estimation error in the coefficients for the CEST terms may be further decreased.

In addition, in the case that the total number TN of the CEST components is decided to be different at Step ST158, the flow goes back to Step ST5, where values of the coefficients for the CEST term and those for the baseline term are recalculated. Therefore, an estimation error in the coefficients for the baseline term and those for the CEST terms may be further decreased.

Moreover, in the first embodiment, the approximate expression EQ. (20) for the CRZ-spectrum $Z_{CRZ}$ is expressed by the sum of the constant term $(b_0)$ and Lorentzian function term. Since the Lorentzian function term comprises three coefficients $(b_1, b_2, \Delta\omega_0)$, the approximate expression EQ. (20) for the CRZ-spectrum $Z_{CRZ}$ comprises four coefficients $(b_0, b_1, b_2, \Delta\omega_a)$ in total. On the other hand, the baseline term used in the approximate expression EQ. (16) for the CPE spectrum $F_{CPE}(\Delta\omega_a)$ is expressed by the sum of the constant term $c_0$ and MT term $c_{MT}(\Delta\omega_a)$. Since $F(\Delta\omega_a)$ in the MT term is not a Lorentzian function but a quadric function of $\Delta\omega_a$ (see EQ. (4)), only one coefficient $(c_{MT})$ is included in the MT term. Therefore, in the approximate expression EQ. (16) for the CPE spectrum $F_{CPE}(\Delta\omega_a)$, the total number of the coefficients included in the baseline term is only two ($c_0$, $c_{MT}$). Thus, when a Z-spectrum is transformed into a CPE spectrum $F_{CPE}(\Delta\omega_a)$, a signal component unaffected by CEST (baseline component) may be identified merely by determining values of the two coefficients ($c_0$, $c_{MT}$), so that precision of fitting may be improved.

While the first embodiment addresses a case in which a sequence having a continuous-wave RF pulse is employed, a second embodiment addresses a case in which a sequence having a plurality of preparation pulses is employed. It should be noted that the MR apparatus in the second embodiment is the same as the MR apparatus 1 in the first embodiment.

Figure 26:
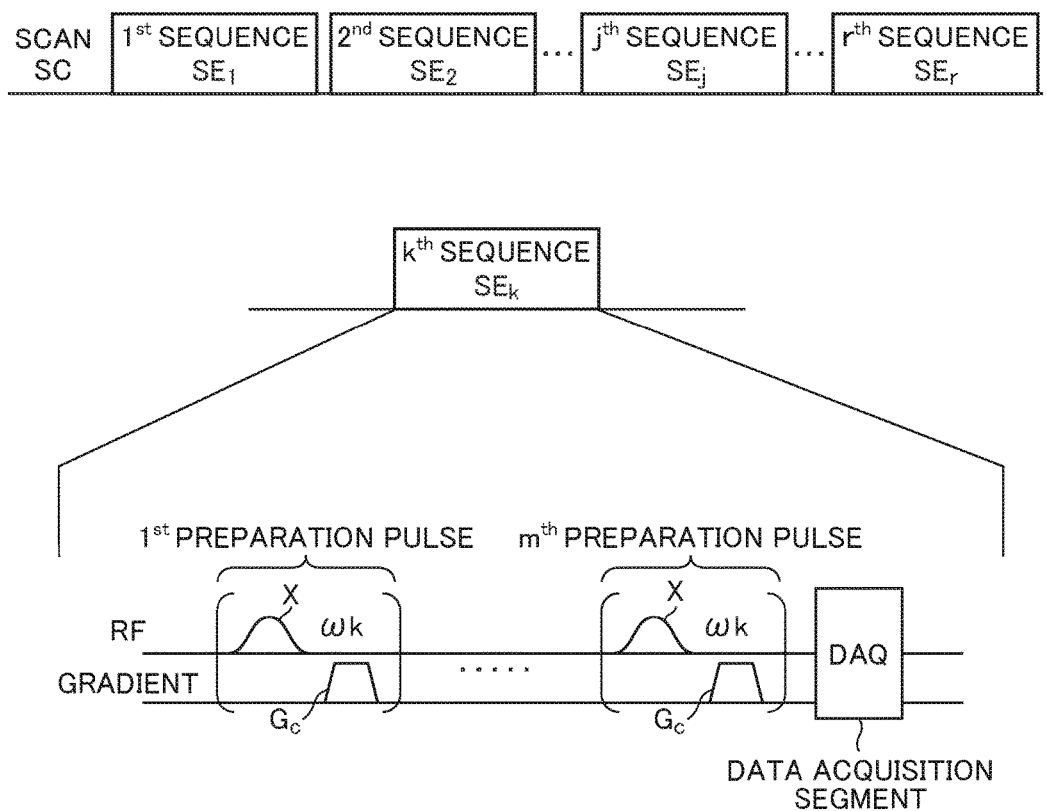
FIG. 26 is a diagram particularly showing a sequence $SE_k$ used in a second embodiment.

FIG. 26 is a diagram particularly showing a sequence $SE_k$ in the second embodiment. A k-th sequence $SE_k$ has m preparation pulses and a data acquisition segment DAQ. Each preparation pulse comprises an RF pulse X and a killer gradient pulse K for bringing longitudinal magnetization into a steady state. The frequency f of the RF pulse X is set to f=fk. The plurality of preparation pulses are repetitively performed, and after an m-th preparation pulse has been performed, a data acquisition segment DAQ for acquiring data by a single-shot technique is performed.

In the case that the sequence shown in FIG. 26 is employed, again, a CPE spectrum $F_{CPE}(\Delta\omega_a)$ may be obtained using EQ. (11), similarly to the sequence (see FIG. 4) employing the continuous-wave RF. Therefore, a similar effect to that in the first embodiment may be achieved in the second embodiment.

A third embodiment will address a case that employs a sequence for acquiring data by a phase cycling technique in which the phase of the RF pulse is cycled.

It should be noted that an MR apparatus in the third embodiment has a hardware configuration similar to that of the MR apparatus 1 in the first embodiment, except for a difference in the units that the processor 9 implements, as compared with the MR apparatus 1 in the first embodiment. Therefore, in explaining the MR apparatus in the third embodiment, description of the hardware configuration is omitted and the processor will be mainly described.

Figure 27:
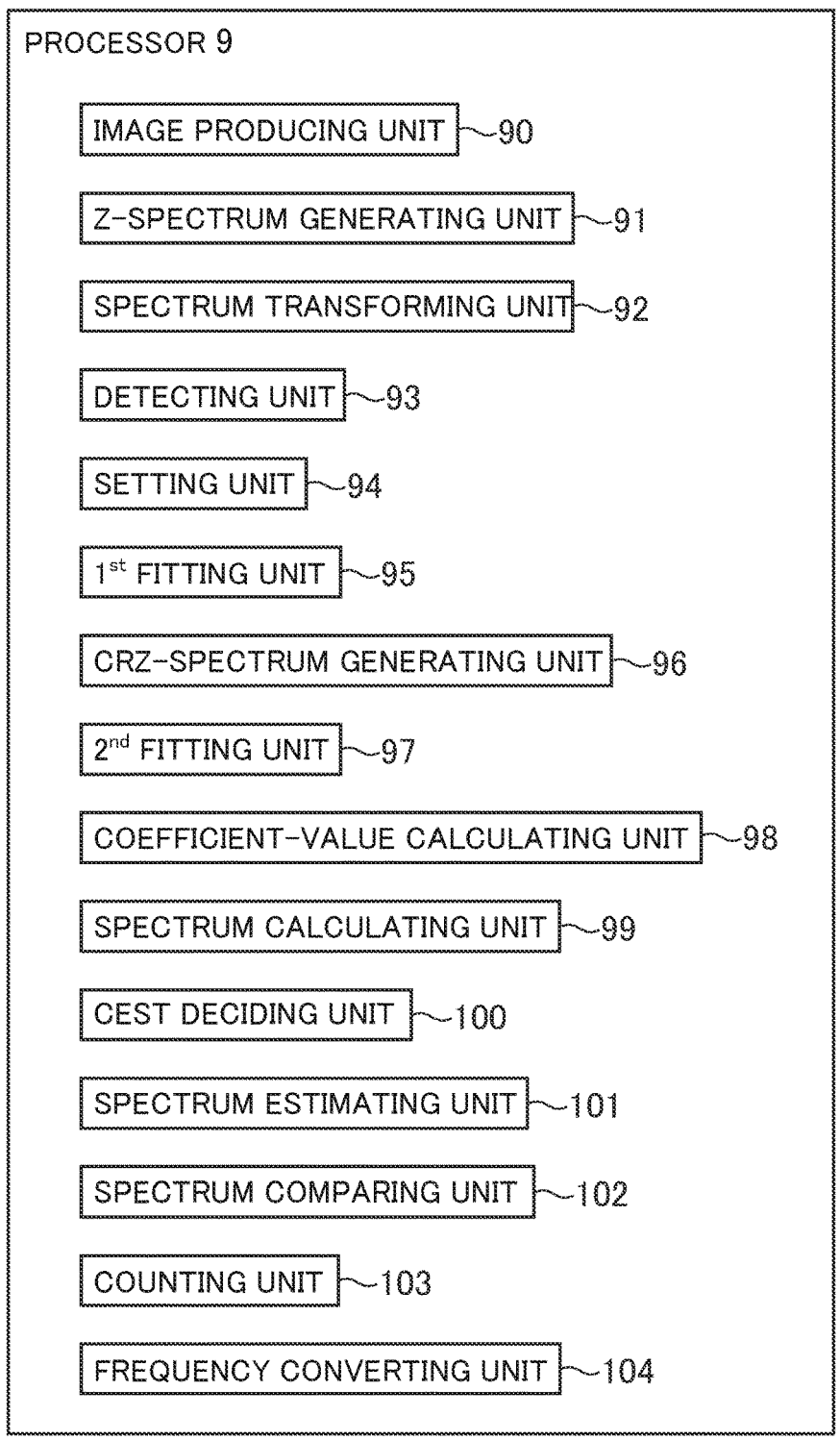
FIG. 27 is a diagram explaining units the processor 9 implements in a third embodiment.

FIG. 27 is a diagram explaining units that the processor 9 implements in the third embodiment. As compared with the processor in the first embodiment, that in the third embodiment is different in points (1) and (2) below.

(1) The Z-spectrum generating unit 91 generates a Z-spectrum. However, the horizontal axis for the Z-spectrum in the first embodiment is the offset frequency, whereas it is the phase difference in the third embodiment, which will be discussed later. (2) The processor comprises frequency converting unit 104 in the third embodiment. The frequency converting unit 104 converts the phase difference into the frequency.

The processor in the third embodiment is similar to that in the first embodiment in other points, and description thereof will be omitted. The processor 9 loads thereon programs stored in the storage section 10 to implement the units 90 to 104 for executing processing written in the programs. Next, a sequence used in the third embodiment will be described.

Figure 28:
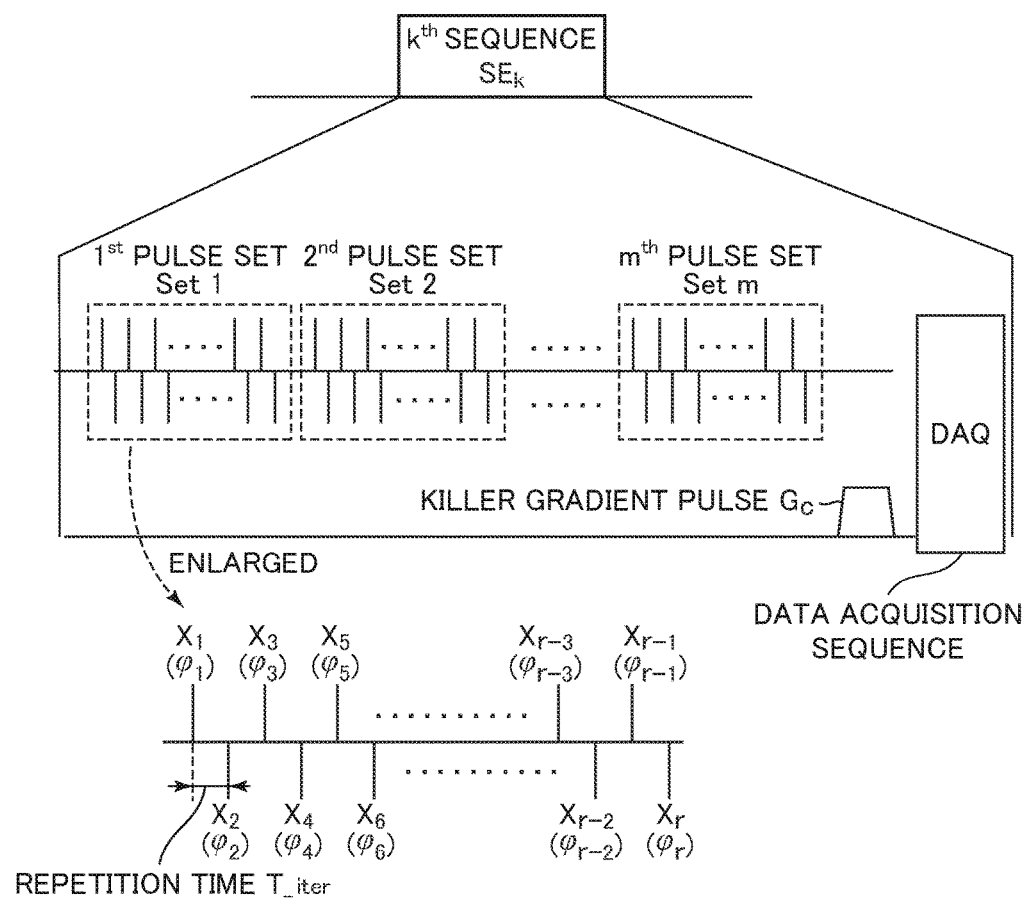
FIG. 28 is a diagram particularly showing a sequence $SE_k$ used in the third embodiment.

FIG. 28 is a diagram particularly showing a sequence $SE_k$ used in the third embodiment. A k-th sequence $SE_k$ comprises first to m-th pulse sets Set1 to Setm, a killer gradient pulse, and a data acquisition segment DAQ. To begin with, the first to m-th pulse sets Set1 to Setm will be described hereinbelow. Since the first to m-th pulse sets Set1 to Setm have the same configuration, description thereof will be made focusing on the representative first pulse set Set1.

FIG. 28 shows the first pulse set Set1 in an enlarged view. The first pulse set Set1 comprises r RF pulses X1 to Xr. The RF pulses X1 to Xr are configured so that a positive RF pulse and a negative RF pulse alternately appear. The RF pulses X1 to Xr are applied in a repetition time T_iter. Symbols "φ1" to "φr" affixed to symbols "X1" to "Xr" denote the phase of the RF pulses.

Next, the phases φ1 to φr of the r RF pulses X1 to Xr will be described. First, consider a p-th RF pulse $X_p$ and a (p+1)-th RF pulse $X_{p+1}$ among the r RF pulses X1 to Xr (where p satisfies 1≤p≤r−1). Representing the phase of the p-th RF pulse $X_p$ by "$\varphi_p$" and that of the (p+1)-th RF pulse $X_{p+1}$ as "$\varphi_{p+1}$," the phase difference $\Delta\varphi(k)=\varphi_{p+1}-\varphi_p$ for the RF pulses in the k-th sequence $SE_k$ is set to satisfy the equations below:

$$\Delta\phi(k) = \phi_{p+1} 0 \phi_p \qquad (30)$$
$$= \frac{2\pi(k-1)}{r}$$

It can be seen from EQ. (30) that the phase difference $\Delta\varphi(k)$ is set to vary according to the value of k.

While FIG. 28 shows the first pulse set Set1, the second to m-th pulse sets Set2 to Setm have a similar configuration to that of the first pulse set Set1. Therefore, any pulse set comprises the r RF pulses X1 to Xr, and is configured so that the phase difference $\Delta\varphi(k)$ in the RF pulse satisfies EQ. (30).

After applying the first to m-th pulse sets Set1 to Setm, a killer gradient pulse for eliminating transverse magnetization is applied. After applying the killer gradient pulse, a data acquisition segment DAQ for acquiring data is performed. It is assumed here that the data acquisition segment DAQ acquires data according to a single-shot technique.

The k-th sequence $SE_k$ is configured as described above. In the third embodiment, the sequence $SE_k$ is performed r times. It is desirable that r have a somewhat large value because a larger number r of times of the sequence performed provide a Z-spectrum with higher frequency resolution. Generally, r may be set to r=16 to 32.

Now let us consider $F(\Delta\omega_a)$ (EQ. (4)) when the sequence according to the phase cycling technique is employed. It has been demonstrated by Miyoshi, et al. that $\Delta\omega_a$ may be replaced by a periodic function given below (Miyoshi M, et al., Proceedings of ISMRM 2014, #3299).

$$\Delta\omega_a^2 \longrightarrow \frac{2}{T_{iter}^2}(1 - \cos\Delta\phi_a) \qquad (31)$$

Accordingly, replacing $\Delta\omega_a^2$ by $2(1-\cos\Delta\varphi_a)/T_{iter}^2$ in EQ. (4), the equation below is given:

$$F(\Delta\phi_a) = \frac{2}{T_{iter}^2}(1 - \cos\Delta\phi_a) \qquad (32)$$

$F(\Delta\varphi_a)$ defined by EQ. (32) is an even function, similar to $F(\Delta\omega_a)$ defined by EQ. (4). Therefore, the ratio R (=Q1/Q2) between the CEST component Q1 and baseline component Q2 in the CPE spectrum may be increased in the vicinity of the frequency $\Delta\omega_C$ as well when using EQ. (32) in place of EQ. (4), as shown in FIGS. 6A-6D. This makes it easy to isolate the CEST component Q1 from the CPE spectrum.

According to the first embodiment, several kinds of spectrums are calculated using equations including the frequency $\Delta\omega_a$ and $\Delta\omega_{c,n}$ as variables. In the third embodiment, however, the spectra (such as the CPE spectrum) should be determined using equations having the phase difference substituted for the frequency because the phase difference is employed in place of the frequency (see EQ. (32)). In particular, the frequencies $\Delta\omega_a$ and $\Delta\omega_{c,n}$ may be replaced by phase differences $\Delta\varphi_a$ and $\Delta\varphi_{c,n}$, respectively, as given below:

$$\Delta\omega_a \to \Delta\varphi_a$$

$$\Delta\omega_c \to \Delta\varphi_c$$

The phase differences $\Delta\varphi_a$ and $\Delta\varphi_{c,n}$ are given by the equation below:

$$\Delta\varphi_a = T_{iter} \times \Delta\omega_a \qquad (33)$$

$$\Delta\varphi_c = T_{iter} \times \Delta\omega_c \qquad (34)$$

In the MR apparatus according to the third embodiment, the processor comprises the frequency converting unit 104 (see FIG. 27) for converting the phase difference into the frequency. The frequency converting unit 104 is capable of converting the phase difference into the frequency based on EQS. (33) and (34). Therefore, it can be seen that the phase difference may be converted into the frequency for the spectra as well when the phase cycling technique is employed.

The invention claimed is:

1. A magnetic resonance apparatus for obtaining information reflecting transfer of magnetization caused by CEST (chemical exchange saturation transfer) between a first substance containing protons and a second substance containing protons, said apparatus comprising:

a scanning unit for performing a plurality of sequences each having an RF pulse, wherein each said sequence is configured to have said RF pulse of different frequency;

a spectrum generating unit for generating a Z-spectrum based on data acquired by said plurality of sequences, said Z-spectrum containing a CEST component representing a signal component affected by CEST and a baseline component representing a signal component unaffected by CEST;

a spectrum transforming unit for transforming said Z-spectrum into a first spectrum so that a ratio between a signal value of a CEST component and that of a baseline component in said first spectrum is larger than a ratio between a signal value of a CEST component and that of a baseline component in said Z-spectrum at a frequency at which an effect of CEST is brought about; and a unit for obtaining information on the CEST component contained in said first spectrum.

2. The magnetic resonance apparatus as recited in claim 1, wherein said unit for obtaining information on the CEST component obtains information on the CEST component contained in said first spectrum based on a first function including a CEST term representing the CEST component and a baseline term representing the baseline component.

3. The magnetic resonance apparatus as recited in claim 2, wherein said CEST term includes a plurality of coefficients, and said unit for obtaining information on the CEST component comprises a first fitting unit for calculating a value of each of the plurality of coefficients included in said CEST term by applying fitting to said first spectrum using said first function.

4. The magnetic resonance apparatus as recited in claim 3, wherein said first fitting unit sets an initial value of each of the plurality of coefficients included in said CEST term, and applies fitting by changing values of the coefficients on the basis of said initial values.

5. The magnetic resonance apparatus as recited in claim 4, comprising a detecting unit for detecting a frequency at which a signal component affected by CEST appears from said first spectrum.

6. The magnetic resonance apparatus as recited in claim 5, wherein one of the plurality of coefficients included in said CEST term represents a frequency at which a signal component affected by CEST appears, and said first fitting unit sets a value of the frequency detected by said detecting unit as an initial value for said one coefficient.

7. The magnetic resonance apparatus as recited in claim 6, comprising a unit for obtaining information on a baseline component contained in said first spectrum based on a second spectrum, wherein the second spectrum is obtained by removing a CEST component from said Z-spectrum.

8. The magnetic resonance apparatus as recited in claim 7, wherein said baseline term includes a plurality of coefficients, and said unit for obtaining information on the baseline component calculates a value of each of the plurality of coefficients included in said baseline term.

* * * * *